(12) United States Patent
Rangarajan et al.

(10) Patent No.: US 8,178,443 B2
(45) Date of Patent: May 15, 2012

(54) HARDMASK MATERIALS

(75) Inventors: Vishwanathan Rangarajan, Beaverton, OR (US); George Andrew Antonelli, Portland, OR (US); Bart van Schravendijk, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 354 days.

(21) Appl. No.: 12/631,709

(22) Filed: Dec. 4, 2009

(65) Prior Publication Data

US 2011/0133313 A1    Jun. 9, 2011

(51) Int. Cl.
*H01L 21/302* (2006.01)
*H01L 21/00* (2006.01)

(52) U.S. Cl. ........ 438/704; 438/509; 438/571; 438/572; 438/717; 257/472; 257/615; 257/616; 257/635; 257/E21.09; 257/E21.127; 257/E21.218; 257/E29.089; 257/E29.148

(58) Field of Classification Search .......... 438/509, 438/571, 572, 704, 717; 257/472, 615, 616, 257/635, E21.09, E21.127, E21.218, E29.089, 257/E29.148
See application file for complete search history.

(56) References Cited

U.S. PATENT DOCUMENTS

| | | | |
|---|---|---|---|
| 6,867,143 B1 * | 3/2005 | Furukawa et al. | 438/704 |
| 2011/0089520 A1 * | 4/2011 | Lieten et al. | 257/472 |
| 2011/0135557 A1 * | 6/2011 | Rangarajan et al. | 423/345 |

FOREIGN PATENT DOCUMENTS

EP    1 703 328 A1    9/2006

OTHER PUBLICATIONS

Hoffman et al., "Plasma-enhanced chemical vapor deposition of silicon, germanium, and tin nitride thin films from metalorganic precursors", J. Vac. Sci. Technol. a, vol. 13, No. 3, May/Jun. 1995, pp. 820-824.*
Rangarajan et al., U.S. Patent Application Entitled "Hardmask Materials", U.S. Appl. No. 12/631,691.

* cited by examiner

*Primary Examiner* — Dao H Nguyen
(74) *Attorney, Agent, or Firm* — Weaver Austin Villeneuve & Sampson LLP

(57) ABSTRACT

Hardmask films having high hardness and low stress are provided. In some embodiments a film has a stress of between about −600 MPa and 600 MPa and hardness of at least about 12 GPa. In some embodiments, a hardmask film is prepared by depositing multiple sub-layers of doped or undoped silicon carbide using multiple densifying plasma post-treatments in a PECVD process chamber. In some embodiments, a hardmask film includes a high-hardness boron-containing film selected from the group consisting of $Si_xB_yC_z$, $Si_xB_yN_z$, $Si_xB_yC_zN_w$, $B_xC_y$, and $B_xN_y$. In some embodiments, a hardmask film includes a germanium-rich $GeN_x$ material comprising at least about 60 atomic % of germanium. These hardmasks can be used in a number of back-end and front-end processing schemes in integrated circuit fabrication.

21 Claims, 22 Drawing Sheets

HARDMASK MATERIALS

FIELD OF THE INVENTION

This invention relates to hardmask films for use in semiconductor processing. The invention also relates to methods and apparatus for forming such films.

BACKGROUND OF THE INVENTION

Hardmask films are commonly used as sacrificial layers during lithographic patterning, e.g., during trench and/or via formation in a Damascene process. In Damascene processing, hardmask film is typically deposited onto a layer of dielectric that needs to be patterned. A layer of photoresist is deposited over the hardmask film (with an optional antireflective layer deposited between the hardmask and the photoresist), and the photoresist is patterned as desired. The lasers are typically used for alignment of the pattern with the underlying structures, and, hence, the hardmasks should be substantially transparent at the wavelengths used for alignment. After the photoresist is developed, the exposed hardmask film below the pattern is removed, and the exposed dielectric is etched such that recessed features of required dimensions are formed. The remaining hardmask serves to protect those portions of dielectric that need to be preserved during the etching process. Therefore, the hardmask material should have a good etch selectivity relative to the dielectric. Reactive ion etching (RIE) which uses halogen-based plasma chemistry is typically employed for dielectric etching.

The etched recessed features are then filled with a conductive material, such as copper, forming the conductive paths of an integrated circuit. Typically, after the recessed features are filled, the hardmask material is completely removed from the partially fabricated semiconductor substrate.

Titanium nitride deposited by physical vapor deposition (PVD) is currently commonly used as a hardmask material for this application. The use of silicon carbide as a hardmask material has also been reported in U.S. Pat. No. 6,455,409 and U.S. Pat. No. 6,506,692.

SUMMARY

Hardmask films with improved properties and their methods of fabrication are provided. In lithographic applications, hardmask materials with low stress are needed because materials with highly compressive or tensile stresses lead to buckling or delamination of the hardmask film on the substrate, and, consequently, to poor pattern alignment in lithography. In addition to low stress, hardmask materials should have high hardness and/or high Young's modulus in order to adequately protect the underlying material, since hardness and modulus typically correlate well with high etch selectivity.

This combination of low stress and high hardness (or high modulus) is especially difficult to achieve, as harder materials typically possess higher compressive stress. For example, conventionally used titanium nitride, while being a relatively hard material, has a compressive stress of greater than about 1,000 MPa. The use of such highly-compressive hardmask, particularly with soft ultra low-k dielectrics (k=2.8 and less), and particularly to define higher aspect ratio features (e.g., features with aspect ratio of 2:1 and higher), leads to poor alignment, and to undesired wiggling of the formed structures. Silicon carbide, in general, can have a wide range of physical properties, and will not possess low stress and high hardness simultaneously, unless it is prepared using special deposition process of this invention.

In some aspects of the invention, hardmask materials having low stress and high hardness are provided. In some embodiments, the films have a hardness of at least about 12 GPa, preferably at least about 16 GPa, such as at least about 20 GPa and a stress of between about −600 MPa and 600 MPa, such as between about −300 MPa and 300 MPa, most preferably between about 0 MPa and 300 MPa. The films are typically substantially metal-free and comprise a material selected from the group consisting of high-hardness low-stress doped or undoped silicon carbide, $Si_xB_yC_z$, $Si_xB_yN_z$, $Si_xB_yC_zN_w$, $B_xN_y$, and $B_xC_y$. These materials can be formed by plasma enhanced chemical vapor deposition (PECVD) and other CVD-based processes. Provided hardmasks can be used in a variety of lithographic schemes in front-end and back-end semiconductor processing applications. Deposition conditions, which provide low-stress high-hardness properties are described. Structural film characteristics that are associated with these properties are also provided.

In one aspect, a method of forming a high-hardness low-stress hardmask film on a semiconductor substrate comprises receiving the semiconductor substrate in a plasma-enhanced chemical vapor deposition (PECVD) process chamber and depositing doped or undoped multi-layer silicon carbide film using multiple densifying plasma treatments. The treatments are performed preferably after deposition of each sublayer of silicon carbide. In some embodiments, the process includes introducing a process gas comprising a silicon-containing precursor (e.g., tetramethylsilane) into the process chamber and forming a plasma to deposit a first sublayer of the silicon carbide hardmask film. Next, the silicon-containing precursor is removed from the process chamber, for example, by purging the chamber with a purging gas. A plasma treatment gas is then introduced into the chamber, the plasma is formed, and the silicon carbide sublayer is plasma-treated to densify the material. The plasma treatment gas may be the same as the purging gas or these gases may be different. Suitable gases for purging and/or plasma treatment include inert gases (e.g., He, Ar), $CO_2$, $N_2$, $NH_3$, and $H_2$. In some embodiments, He, Ar, $H_2$ or various mixtures thereof are preferred for both purging and for plasma treatment. After the first sublayer of silicon carbide was plasma-treated, the depositing, purging, and plasma-treatment operations are repeated to form and densify additional sublayers of silicon carbide. Typically, each sublayer has a thickness of less than about 100 Å, e.g., less than about 50 Å to allow good densification. The method, in some embodiments, involves depositing and densifying 10 or more sublayers, e.g., 20 or more sublayers to form the hardmask film, which, in some embodiments, has a thickness of between about 1,000 Å and about 6,000 Å.

The multiple plasma treatments improve hardness of the film as compared with a single-layer silicon carbide film. In some embodiments, the formed high-hardness low-stress film comprises undoped silicon carbide film having high content of Si—C bonding. In some embodiments the ratio of areas of Si—C peak in the IR spectrum relative to Si—H is at least about 20. In some embodiments the ratio of areas of Si—C peak in the IR spectrum relative to C—H is at least about 50. Provided silicon carbide films also typically have a density of at least about 2 g/cm³. In some embodiments it is preferable to perform plasma post-treatment using high frequency radio frequency (HFRF) and low frequency radio frequency (LFRF) plasma generation, where the LF/HF power ratio is at least about 1.5, e.g., at least about 2.

In another aspect of the invention, the method for forming high-hardness low-stress film involves depositing a boron-containing film selected from the group consisting of $Si_xB_yC_z$, $Si_xB_yN_z$, $Si_xB_yC_zN_w$, $B_xN_y$, and $B_xC_y$. These films can be deposited by PECVD using appropriate silicon, carbon, and boron-containing precursors. For example, for deposition of $Si_xB_yC_z$, in one embodiment, a boron-containing precursor (e.g., $B_2H_6$) and a precursor comprising carbon and silicon (e.g., tetramethylsilane) are provided into a PECVD process chamber to form a $Si_xB_yC_z$ film in a plasma. In order to make a high-hardness and low-stress film, dual frequency plasma with LF/HF power ratio of at least about 1.5, such as at least about 2, is preferred. In some embodiments, the films are boron-rich, with ratio of BC/[BC+SiC] of at least about 0.35, as determined by areas of corresponding peaks in the IR spectrum. High-hardness boron-rich $Si_xB_yC_z$ film is prepared, in some embodiments, by flowing $B_2H_6$ at a flow rate that is at least about 2 times greater than the flow rate of tetramethylsilane. Advantageously, boron-containing films can be easily removed after patterning is completed by chemical mechanical polishing (CMP) because boron-containing films are typically hydrophilic and are susceptible to solubilization with CMP chemistries.

In another aspect of the invention, a method for forming a $GeN_x$ hardmask film is provided. The method comprises, in some embodiments, receiving a semiconductor substrate in a PECVD process chamber and forming a $GeN_x$ hardmask film. The film can be formed by flowing a germanium-containing precursor and a nitrogen-containing precursor into a PECVD process chamber and forming a plasma. In some embodiments the formed $GeN_x$ film has a modulus of at least about 100 GPa, and is germanium-rich. In some embodiments, the germanium-rich film comprises at least about 60 atomic %, preferably 70 atomic % germanium (excluding hydrogen). The density of the film can exceed 4 g/cm$^3$. Advantageously, the $GeN_x$ is substantially transparent at the alignment wavelength used in lithographic patterning (e.g. in visible and near IR parts of the spectrum). In some embodiments, the $GeN_x$ film is deposited by forming a plasma in a process gas comprising germane, ammonia and nitrogen, where the germane/ammonia flow rate ratio is at least about 0.05. In some embodiments, dual-frequency plasma source is preferably used to deposit the $GeN_x$ film. In some embodiments, the LF/HF power ratio used during deposition is at least about 1. The $GeN_x$ film, similarly to other films mentioned above can be used in a number of processing schemes in back-end and front-end semiconductor processing.

In some embodiments, a hardmask film (such as any of the films described above) is deposited on a layer of dielectric, e.g., a dielectric having a dielectric constant of less than about 3, such as less than about 2.8. A layer of photoresist is typically deposited over the hardmask (but not necessarily in direct contact with the hardmask, as antireflective layers may be deposited in between). Next, lithographic patterning is performed, in which recessed features (a via and/or a trench) are formed in the dielectric layer. After the patterning is completed and the features are filled with metal, the hardmask is removed (e.g., by CMP). In some embodiments the etch selectivity of the hardmask film relative to dielectric is at least about 8:1, referring to chemistry used to etch vias and/or trenches, which is typically an RIE process.

In other embodiments, a hardmask film (such as any of the films described above) is deposited on a layer of polysilicon in front-end processing and serves to protect polysilicon during various processing steps. In some embodiments, the hardmask material is not removed and will remain in the manufactured device.

These and other features and advantages of the present invention will be described in more detail below with reference to the associated drawings.

DETAILED DESCRIPTION OF A PREFERRED EMBODIMENT

Introduction and Overview

Figure 1A:
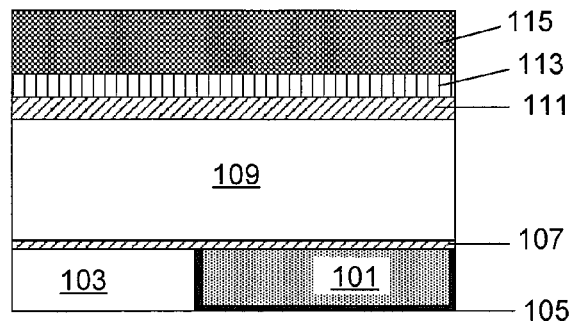
FIGS. 1A-1K show cross-sectional depictions of device structures created during an illustrative back-end lithographic process in semiconductor device fabrication, using hardmasks provided herein.

Hardmask films for back-end and front-end semiconductor processing applications are provided. The films comprise materials selected from the group consisting of $SiC_x$ (doped or undoped), $Si_xB_yC_z$, $Si_xB_yN_z$, $Si_xB_yC_zN_w$, $B_xN_y$, $B_xC_y$, and $GeN_x$.

The materials consist essentially of the elements that are recited in the corresponding formulas and optionally include hydrogen which is not explicitly recited. The subscripts x, y, z, and w indicate that the materials are not necessarily stoichiometric. The materials include dopants only if presence of dopants is explicitly mentioned. For example, undoped $SiC_x$ (silicon carbide) described herein is a material which consists essentially of silicon and carbon (not necessarily in stoichiometric proportions) and optionally includes hydrogen. Doped $SiC_x$ further includes a dopant element, such as boron, oxygen, phosphorus, or nitrogen.

In some embodiments materials provided herein have one or more of the following advantageous properties: high hardness, high Young's modulus, and low stress. In preferred embodiments, the materials simultaneously possess a combination of high hardness and low stress, making them particularly well suited for hardmask applications at advanced technology nodes (e.g., at 45 nm and less, e.g., at 22 nm technology node), especially for patterning of mechanically weak ultra low-k (ULK) dielectrics, and for forming recesses with aspect ratios of 2:1 and greater (e.g., 4:1 and greater).

In some embodiments the hardmask materials have a hardness of at least about 12 GPa, such as at least about 16 GPa, e.g., at least about 18 GPa or at least about 20 GPa. Hardness is a well-defined property in the field of material engineering and can be reliably measured, e.g., by any suitable apparatus including a nano-indentation device. In some embodiments, in addition to high hardness, the hardmask materials have low stress of between about −600-600 MPa, such as between about −300 MPa and 300 MPa, between about 0-600 MPa, and most preferably between about 0 MPa and 300 MPa.

Compressive and tensile stresses are measured on one scale with positive values corresponding to tensile stress and negative values corresponding to compressive stress. On this scale, higher compressive stress is characterized by lower negative values, while higher tensile stress is characterized by higher positive values. Films having no residual stress correspond to zero on this scale. Stress is a well-defined parameter that can be measured, e.g., using a "Flexus" tool available from KLA-Tencor Corporation.

Materials having high compressive stress tend to cause buckling of a substrate, while materials having high tensile stress tend to cause delamination (particularly when adhesion between materials is poor). Both types of stress are not desired in the hardmask materials. However, low and moderate tensile stress (e.g., 200-600 MPa), such as present in some of boron-containing materials described herein, can be tolerated better than compressive stress of the same magnitude.

In some embodiments, hardmask films described herein have Young's modulus of at least about 100 MPa, such as at least about 125 MPa, e.g., 150 MPa and greater. Young's modulus can be measured by standard technique using nano-indentation devices.

It is noted that hardmask materials described herein are generally distinct from materials that are used as dielectric diffusion barrier layers and etch-stop layers. Dielectric diffusion barrier and etch-stop materials are typically relatively soft materials having hardness of less than about 10 GPa and a dielectric constant that is less than about 5. Diffusion barrier layers are preserved in the final integrated circuit structure, where low dielectric constant is necessary. In contrast, hardmask materials provided herein do not necessarily need to possess low dielectric constant, and typically have a dielectric constant of greater than about 4, such as greater than about 5, or greater than about 6. This is because hardmasks, in many embodiments, are sacrificial layers, which are completely removed from the structure after patterning, and therefore do not contribute to electrical properties of the formed integrated circuit. In those embodiments, where the hardmasks are not removed from the final structure, they are present in such locations, where low dielectric constant is not necessary, or where the device can tolerate materials with relatively high dielectric constant. Further, hardmask materials deposited by PECVD are typically deposited using significantly higher power in plasma generation than softer low-k diffusion barrier materials. Structurally, hardmask materials typically are more closely packed and are denser than softer low-k diffusion barrier materials.

Provided hardmask materials are, in many embodiments, substantially transparent at the laser wavelength that is used for pattern alignment (such as at wavelengths in visible and near-IR parts of the spectrum, e.g., at 633 nm).

The thicknesses of deposited hardmask films depend on many parameters, such as on etch selectivity of a particular hardmask material versus the underlying material, the thickness of underlying material that needs to be etched, and the etch chemistry used. In general, harder hardmask materials with higher etch selectivity can be deposited to form thinner films than materials with lower hardness and lower etch selectivity. Additionally, thinner hardmask layers made of hard highly-selective materials are advantageous because they allow for better optical alignment due to relatively higher transparency of thinner films. In some embodiments, the films are deposited to a thickness of between about 100-10,000 Å, such as to between about 500-6000 Å

The provided films possess high etch selectivity relative to dielectrics (such as relative to dielectrics having dielectric constant of 3.0 and less, such as 2.8 and less, or 2.4 and less) in chemistries that are used for via and/or trench etching. Example etch chemistry includes RIE using plasma formed in a process gas comprising $C_xF_y$ (e.g., $CF_4$), inert gas (e.g., Ar) and an oxidizer (e.g., $O_2$). Other dry etches, such as plasma etching with a process gas comprising $Cl_2$ and $N_2$ may be used. Etch selectivities of at least about 5:1, such as at least about 8:1 (i.e. hardmask material is etched at least 8 times slower than the dielectric) can be obtained in some embodiments, such as for a plasma etch chemistry comprising $C_xF_y$ mentioned above. In some embodiments provided films can serve as hardmasks during wet etching operations, e.g., in selective wet etching of silicon oxide based materials with a wet fluoride etching chemistry.

The dielectrics that can be etched in the presence of exposed hardmask materials provided herein include silicon oxide, carbon-doped silicon oxide (SiCOH), TEOS (tetraethyl orthosilicate)-deposited oxide, various silicate glasses, hydrogen silsesquioxane (HSQ), methylsilsesquioxane (MSQ), as well as porous and/or organic dielectrics, which include polyimides, polynorbornenes, benzocyclobutene, etc. The provided hardmasks are most advantageously used for patterning of mechanically weak organic and/or porous dielectrics having dielectric constant of 2.8 and less, such as 2.4 and less.

Hardmask materials described herein generally can be deposited using a variety of methods, including CVD-based methods and PVD-based methods. PECVD is a particularly preferred deposition method, and PECVD, which allows for dual-frequency plasma generation is even more preferred. Apparatuses having high frequency and a low frequency power sources include SEQUEL® and VECTOR® tools available from Novellus Systems, of San Jose, Calif. Low frequency radio frequency (RF) power refers to RF power having a frequency between 100 kHz and 2 MHz. A typical frequency range for LF plasma source is between about 100 kHz to 500 kHz, e.g., 400 kHz frequency may be used. During deposition of the hardmask layers, LF power density typically ranges at about 0.001-1.3 W/cm$^2$, in particular embodiments, at about 0.1-0.7 W/cm$^2$. HF power typically ranges at about 0.001-1.3 W/cm$^2$ and in particular embodiments, at about 0.02-0.28 W/cm$^2$. High frequency power refers to RF power with a frequency greater than 2 MHz. Typically HF RF frequency lies in the range of between about 2 MHz-30 MHz. A commonly used HF RF values include 13.56 MHz and 27 MHz In certain embodiments, the deposition of hardmasks involves setting LF/HF power ratio of at least about 1, such as at least about 1.5, e.g., at least about 2.

During PECVD deposition, the reactant gas or vapor is provided to the processing chamber typically at a flow rate ranging from 0.001 sccm to about 10000 sccm, preferably from about 1 sccm to about 1000 sccm, and using substrate pedestal temperatures ranging from about 20° C. to about 500° C., preferably from about 200° C. to about 450° C. In some embodiments, temperatures lower than about 400° C. (e.g., from about 200° C. to about 400° C.) are preferable for hardmask deposition. Pressure may range from about 10 mTorr to about 100 Torr, preferably from about 0.5 Torr to 5 Torr. It is understood that flow rates of precursors can vary depending on the size of the substrate and chamber size.

Use in Back-End Processing

Figure 3:
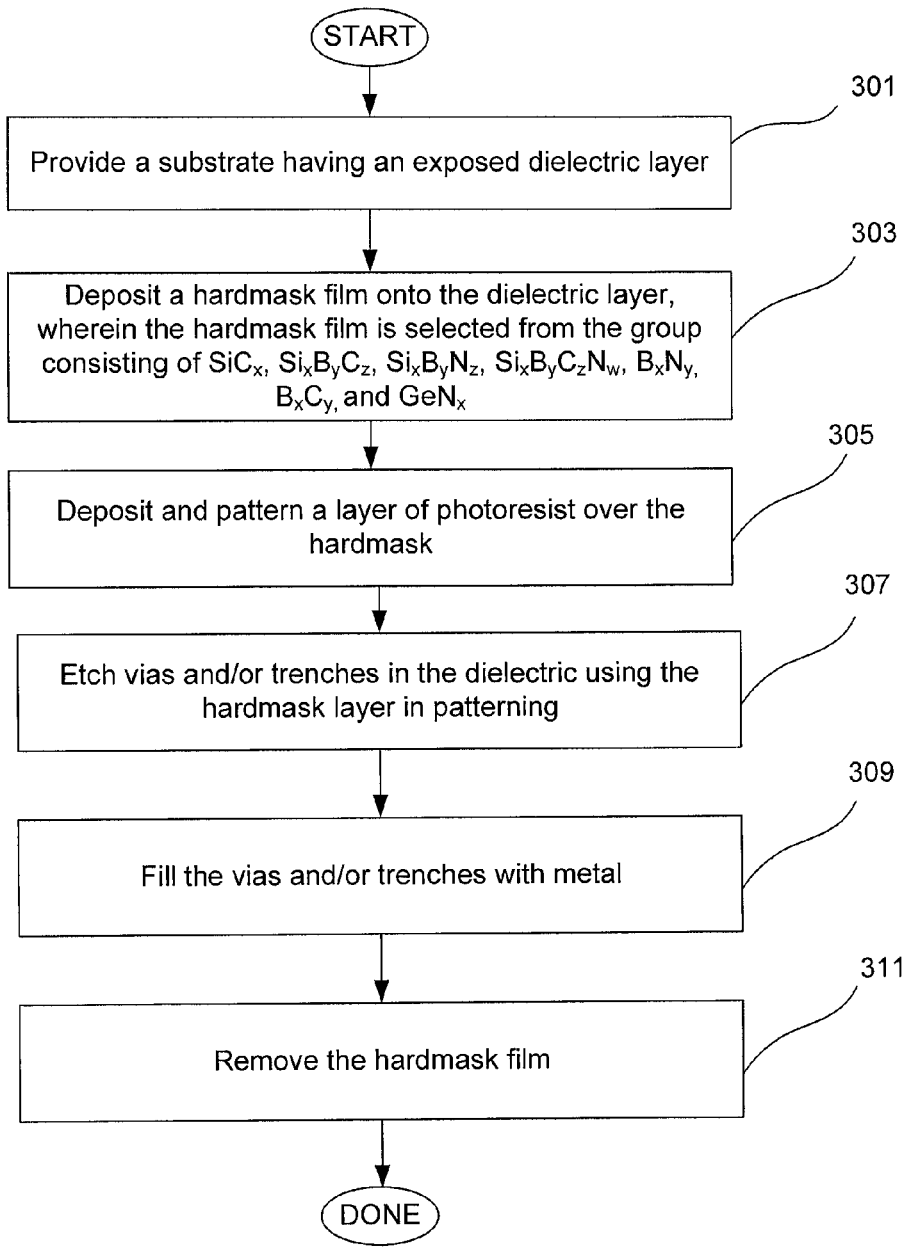
FIG. 3 is a process flow diagram for a back-end lithographic process suitable for use with hardmasks provided herein.

Provided films can be used in a variety of hardmask applications. An exemplary use of hardmask films in back-end processing is illustrated by structures shown in FIGS. 1A-1K, and by the process flow diagram shown in FIG. 3. Referring to the illustrative process flow of FIG. 3, the process starts in 301 by providing a substrate having an exposed dielectric layer. The substrate is typically a semiconductor (e.g., silicon) wafer having one or more layers of material (such as conductors or dielectrics) residing thereon. The exposed portion of the substrate contains a layer of dielectric that needs to be patterned with vias and trenches. The hardmasks provided herein can be generally used in patterning of a variety of dielectric materials listed in the previous section. It is particularly advantageous to use provided hardmask materials for patterning ULK dielectrics with dielectric constant of 2.8 and less, such as 2.4 and less, including mechanically less strong porous and organic dielectrics. As explained above, provided hardmasks, in many embodiments, possess very low stress, and can significantly reduce buckling and poor pattern alignment, which typically occurs when high-stress hardmask materials are used in patterning of mechanically weak ULK dielectrics. It is noted that in some embodiments, a buffer layer of mechanically stronger material is used between the fragile ULK dielectric and the hardmask. Thus, in some embodiments, the provided substrate has an exposed buffer layer (such as a mechanically stronger dielectric) residing on a layer of ULK material. For example, a buffer layer comprising a dielectric having k of greater than 2.8 can reside on a mechanically less strong dielectric with a lower dielectric constant. For example, a buffer layer comprising a material selected from the group consisting of carbon-doped silicon oxide (SiCOH), TEOS (tetraethyl orthosilicate)-deposited oxide, various silicate glasses, hydrogen silsesquioxane (HSQ), and methylsilsesquioxane (MSQ), can reside on a porous and/or organic dielectric, which may include polyimides, polynorbornenes, benzocyclobutene, etc. The ULK dielectrics and buffer layer dielectrics can be deposited, for example, by spin-on methods or by PECVD. In some embodiments the dielectric and/or buffer layer are deposited in the same PECVD module as the hardmask layer deposited thereon. This provides an additional advantage over titanium nitride hardmasks, which require PVD module for deposition. In operation 303 the hardmask material is deposited onto the dielectric layer (or onto the buffer layer, which typically is also a dielectric) in a PECVD process chamber. Next, one or more antireflective layers, such as bottom anti-reflective coating (BARC) are optionally deposited, followed by deposition of photoresist over the hardmask in operation 305. It is noted that photoresist is not necessarily in direct contact with the hardmask material, since one or more antireflective layers typically reside between the hardmask and photoresist. Next, in operation 307 vias and/or trenches are etched in the dielectric layer using the deposited hardmask, and lithographic patterning. Suitable etches include RIE described in the previous section, where the dielectric material is etched in the presence of exposed hardmask having high etch selectivity for the etch.

A variety of lithographic schemes, which may include deposition and removal of multiple photoresist layers, deposition of filler layers, etc., may be used to form the desired pattern of recessed features. These lithographic schemes are known in the art, and will not be described in detail. A scheme, which defines a trench first and then forms a partial via is used as an illustration in FIGS. 1A-1K. It is understood, however, that back-end processing can use a variety of other schemes. After the vias and/or trenches are formed, the vias and/or trenches are filled with metal (such as electrodeposited copper or its alloy) in 309, and the hardmask film is removed in operation 311, e.g., by CMP or appropriate wet or dry etch. In some embodiments, wet etching or CMP compositions containing a peroxide (such as acidic slurries containing hydrogen peroxide) are preferred for hardmask removal.

FIGS. 1A-1K show schematic cross-sectional views of a partially fabricated semiconductor substrate during back-end processing, according to one illustrative processing scheme. FIG. 1A shows a portion of semiconductor substrate (underlying silicon layer and active devices are not shown) having a copper layer 101 embedded in a first layer of dielectric 103 (e.g., a ULK dielectric), where a diffusion barrier layer 105 (e.g., including Ta, Ti, W, TaN$_x$, TiN$_x$, WN$_x$ or combinations thereof) resides at an interface between the dielectric and copper. A dielectric diffusion barrier layer (also known as etch-stop layer) 107, such as silicon nitride or nitrogen-doped silicon carbide layer resides on top of copper 101 and dielectric 103. A second dielectric layer 109 (e.g., a spin-on or PECVD-deposited ULK dielectric) resides on top of the dielectric diffusion barrier layer 107. Because dielectric layer 109 can be mechanically weak, and can be damaged during hardmask deposition, a mechanically stronger dielectric buffer layer 111, e.g., TEOS dielectric or carbon-doped silicon oxide (SiCOH) is deposited onto the layer 109. The hardmask layer 113, which includes a high-hardness material described herein, is deposited onto the buffer layer 111 by PECVD. Unlike dielectric diffusion barrier layer 107, the hardmask layer 113 is deposited on a surface that does not include exposed metal. A layer of photoresist 115 is deposited over the hardmask 113 by a spin-on method. Typically one or more antireflective layers are deposited immediately between the hardmask and the photoresist. These layers are not shown to preserve clarity.

Figure 1B:
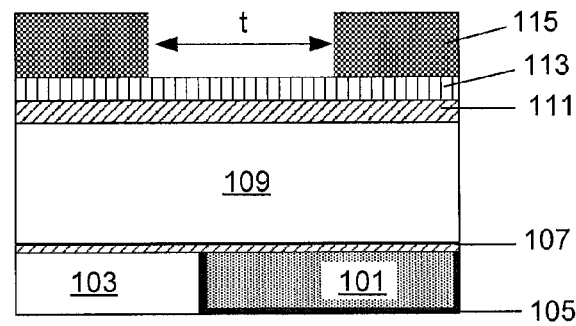
Figure 1C:
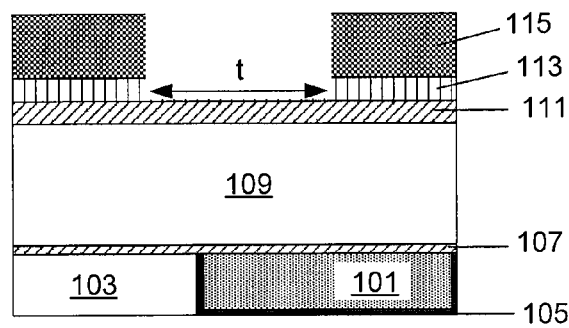
Figure 1D:
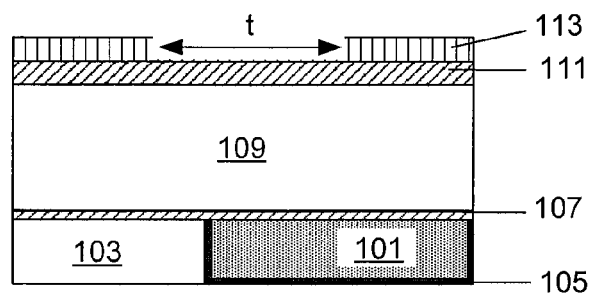
Figure 1E:
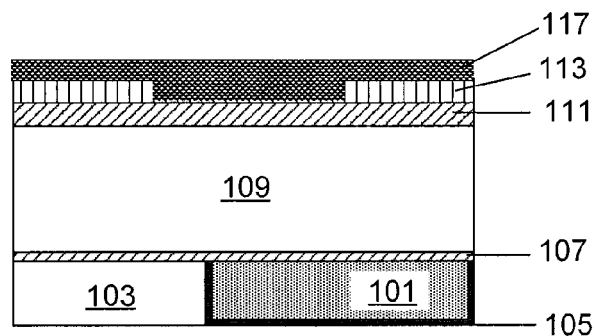
Figure 1F:
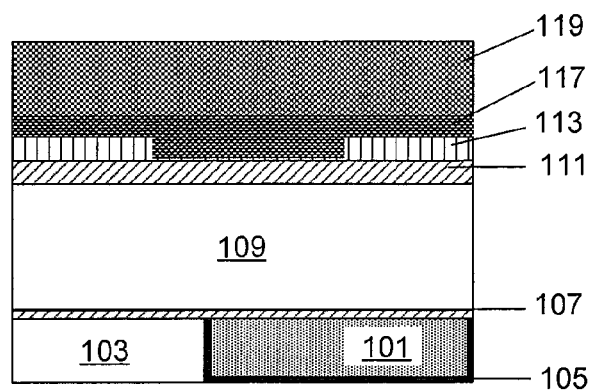
Figure 1G:
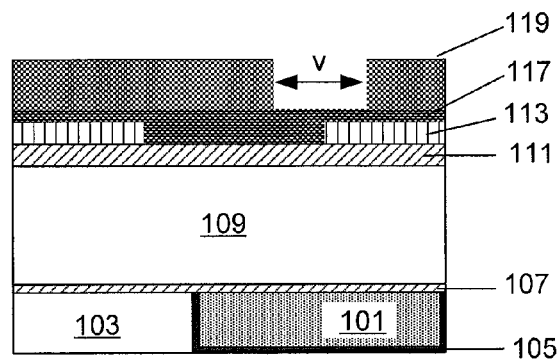
Figure 1H:
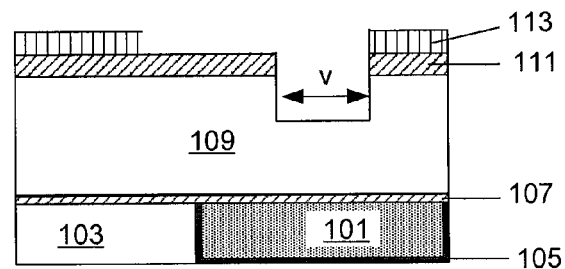
Figure 1I:
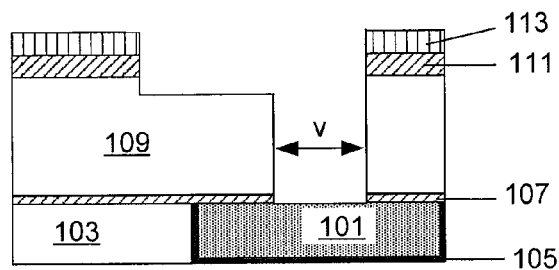
Figure 1J:
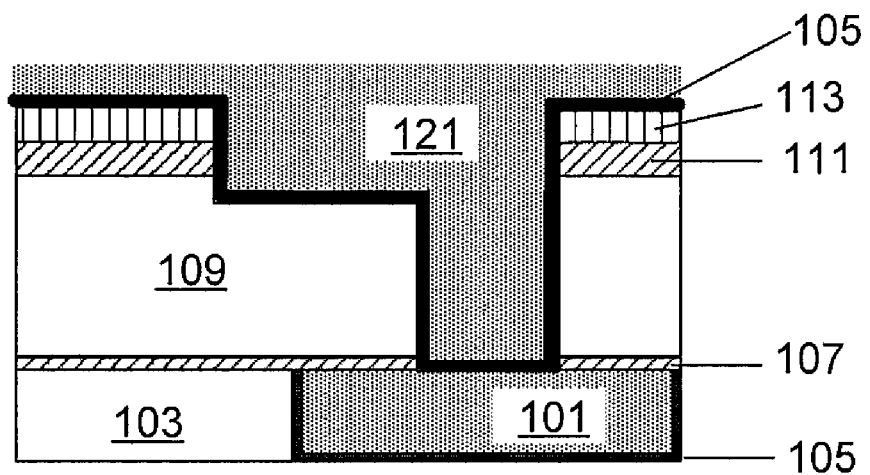
Figure 1K:
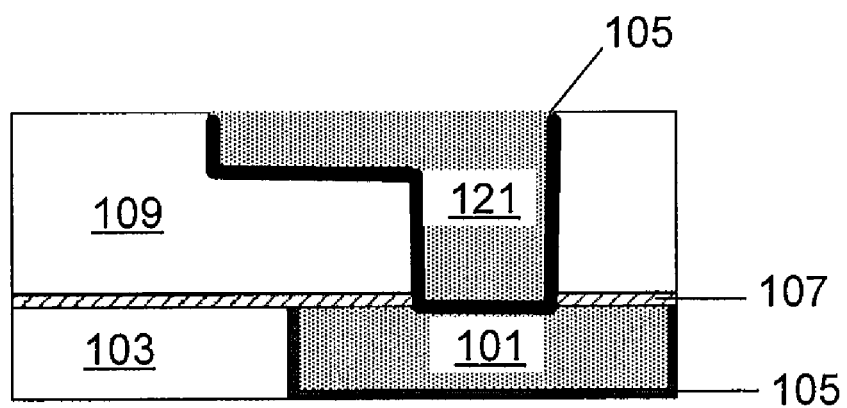

After the photoresist 115 has been deposited, it is patterned using standard lithographic techniques, to form an opening having width t, which will be used to form the future trench. The resulting structure with patterned photoresist layer 115 is shown in FIG. 1B. Next, the hardmask layer 113 residing below the removed photoresist, is opened (etched), forming a pattern of exposed dielectric 111, as shown in FIG. 1C. The remaining hardmask will serve to protect the dielectric during photoresist removal and subsequent dielectric etch. Next, photoresist layer 115 is removed from the structure, e.g., by ashing, and a structure having exposed patterned hardmask 113 is formed. At this stage, patterning to form a via is initiated. To pattern a via, a filler layer 117, which may comprise an easily removable dielectric, such as HSQ or MSQ, is deposited over the surface of the structure, filling the opening in the hardmask, as shown in FIG. 1E. Next, a second layer of photoresist 119 is deposited over the filler layer 117 (with optional antireflective layers in between), to form the structure shown in FIG. 1F. The photoresist 119 is then patterned to form an opening having width V, which will be used in formation of a via, as shown in structure 1G. Next, the hardmask below the photoresist pattern is removed, and a via is partially etched in the dielectric 109, e.g., using RIE. The photoresist 119, and the filler layer 117 are removed, forming a structure having a partially etched via and a defined trench, shown in FIG. 1H. Next, etching of dielectric layers 111 and 109 continues until the via reaches the etch stop layer 107, which is then subsequently etched through to expose metal layer 101 at the bottom of the via, as shown in FIG. 1I. A layer of diffusion barrier material 105 is then conformally deposited by PVD to line the substrate within the recessed features and in the field region. This is followed by filling the recessed features with metal 121 (e.g., electrodeposited copper or its alloy) typically with some overburden in the field, providing a structure shown in FIG. 1J. Next, metal overburden, diffusion barrier material 105, hardmask layer 113, and dielectric buffer layer 111 are removed from the field region of the structure forming a partially fabricated device having a metal interconnect residing in low-k dielectric layer 109, as shown in FIG. 1K. In other processing schemes, the buffer layer 111, will not be removed and will remain on the substrate.

The processing scheme which involves formation of a partial via, as shown in FIGS. 1A-1K illustrates one possible patterning scheme for low-k dielectric. Hardmask materials provided herein can be used in a variety of other processing schemes, including both via-first and trench-first schemes.

Use in Front-End Processing

Another illustrative use of provided hardmasks is protection of polysilicon during front-end processing. Polysilicon is widely used during formation of active devices (e.g., transistors) on semiconductor wafers. In some embodiments, provided hardmask materials are deposited onto polysilicon, and are used to protect polysilicon during various processing operations used in active device fabrication. Notably, in front-end processing in many embodiments, the provided hardmask layers are not sacrificial and remain in the final device residing in contact with polysilicon.

Figure 2A:
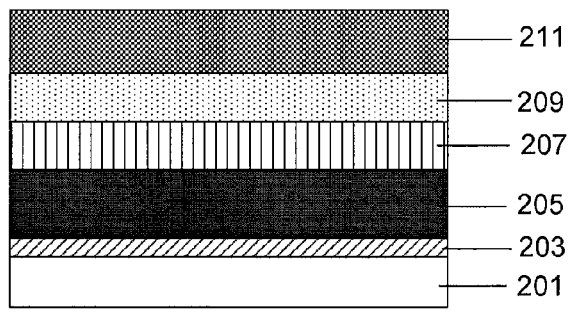
FIGS. 2A-2E show cross-sectional depictions of device structures created during an illustrative front-end lithographic process in semiconductor device fabrication using hardmasks provided herein.
Figure 2B:
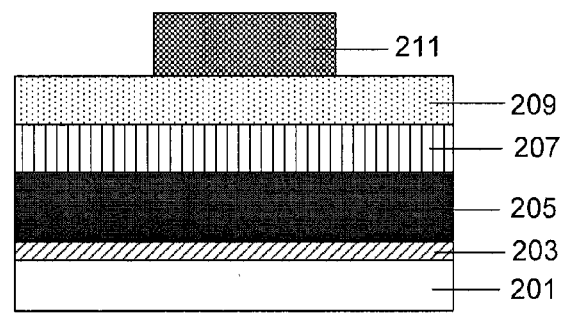
Figure 2C:
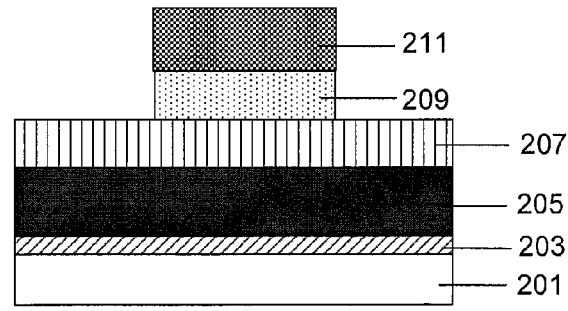
Figure 2D:
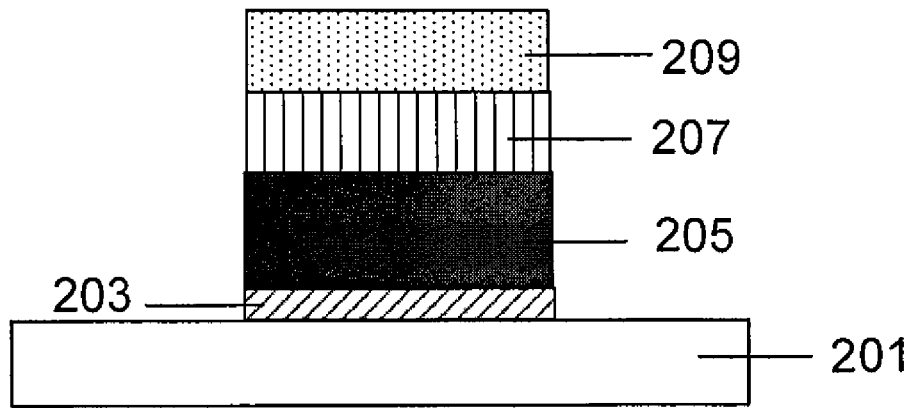
Figure 4:
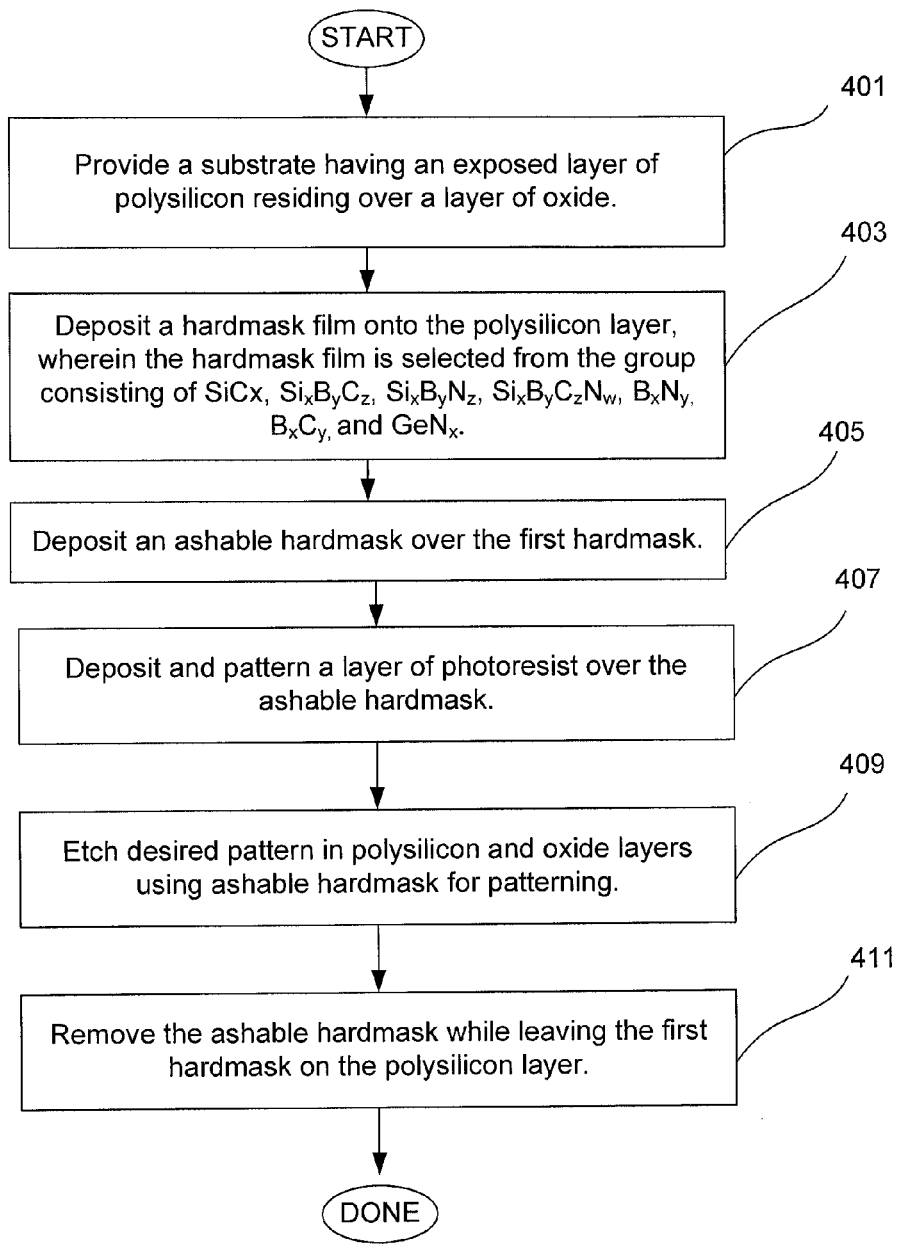
FIG. 4 is a process flow diagram for a front-end lithographic process suitable for use with hardmasks provided herein.

An illustrative front-end processing scheme is shown in the process flow diagram of FIG. 4, and is further illustrated by schematic cross-sectional views of partially fabricated structures shown in FIGS. 2A-2E. Referring to FIG. 4, the process starts in 401, which provides a substrate having an exposed layer of polysilicon residing over layer of an oxide (e.g., silicon oxide, hafnium oxide, etc.). In other embodiments, the polysilicon may reside over different active layers. The oxide typically resides on a layer of single-crystal silicon. In order to pattern oxide and polysilicon layers, two hardmask layers are deposited over the polysilicon layer. The first hardmask is deposited directly onto the layer of polysilicon and includes a material described herein, such as $SiC_x$ (doped or undoped), $Si_xB_yC_z$, $Si_xB_yN_z$, $Si_xB_yC_zN_w$, $B_xN_y$, $B_xC_y$, and $GeN_x$, as shown in operation 403. The hardmask is deposited by a CVD technique, more preferably by PECVD. Next, an ashable hardmask (e.g., a hardmask consisting essentially of carbon (with hydrogen optionally present)) is deposited over the first hardmask in operation 405. The ashable hardmask may also be deposited by a CVD technique, such as by PECVD deposition using a hydrocarbon precursor. Next, a layer of photoresist is deposited over the ashable hardmask and the photoresist is patterned as desired, as shown in operation 407. One or more antireflective layers may be optionally deposited between the ashable hardmask and the photoresist, which are not shown to preserve clarity. An illustrative structure having an unpatterned photoresist is illustrated in FIG. 2A, where layer 201 is a layer of single-crystal silicon. The layer 203, residing on the silicon layer 201 is a layer of oxide. The layer 205 on top of oxide layer 203 is a layer of polysilicon. A hardmask material described herein, 207, resides directly on top of polysilicon 205, and an ashable hardmask (e.g., a carbon hardmask) 209 resides over the first hardmask layer 207. A layer of photoresist 211 resides over the ashable hardmask 209 (optional antireflective layers in between are not shown). The structure, obtained after photoresist patterning is shown in FIG. 2B, which illustrates that photoresist is removed at two locations, leaving a portion in-between.

Referring again to FIG. 4, the process follows in operation 409, by etching a desired pattern in polysilicon and oxide layers using the ashable hardmask for patterning. This is illustrated by structures 2C-2E. In structure 2C, the ashable hardmask layer 209 is opened (etched) at the portions exposed after photoresist patterning. Next, the photoresist 211 is removed completely, and first hardmask layer 207, the polysilicon layer 205 and the oxide layer 203 are etched at the portions that are not protected by the ashable hardmask layer 209, providing a structure shown in FIG. 2D.

Figure 2E:
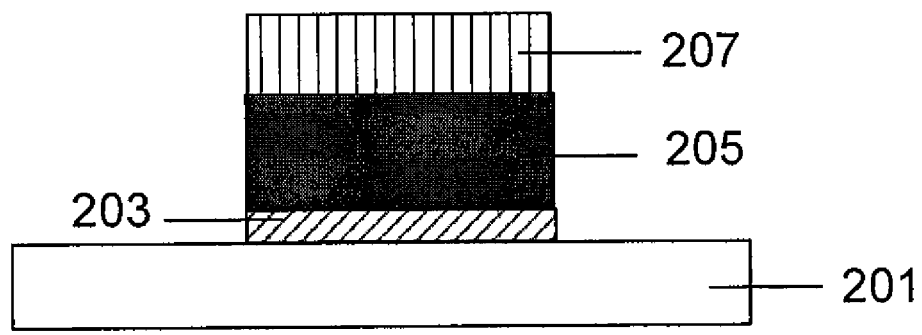

Referring again to FIG. 4, in operation 411, the ashable hardmask is removed, e.g., by oxygen plasma treatment, while leaving the first hardmask layer containing a material selected from the group consisting of $SiC_x$ (doped or undoped), $Si_xB_yC_z$, $Si_xB_yN_z$, $Si_xB_yC_zN_w$, $B_xN_y$, $B_xC_y$ and $GeN_x$ on the polysilicon layer. The resulting structure is shown in FIG. 2E. The hardmask layer 207, can be retained during subsequent front-end processing and can serve to protect polysilicon during a variety of subsequent operations, such as during implantation of dopants into the crystalline silicon. It is noted that the hardmask material in the described process sequence does not perform actual masking (which is accomplished by ashable hardmask 209) but is used mainly for protection of polysilicon. Depending on the integration scheme, the hardmask 207 may be used for masking in subsequent front-end operations, such as during dry or wet etching in cleaning, or during etching of an oxide performed to define a gate. The hardmask material may be eventually removed from the final device, or may remain in the device, depending on the integration scheme that is used.

The back-end and front-end applications illustrated above are provided as exemplary sequences, and it is understood that provided materials can be used in a variety of other processes where high-hardness materials are desired for protection of underlying layers.

Preparation of suitable hardmask materials will now be described in detail.

Multi-Layer Silicon Carbide Film

In one embodiment, a multi-layer silicon carbide film having high hardness and low stress is provided. Specifically, the film has, in some embodiments, hardness of greater than about 12 GPa, such as greater than about 18 GPa and stress of between about −600 MPa-600 MPa, such as between about −300 MPa-300 MPa. The film is formed by depositing sublayers of doped or undoped silicon carbide material, and performing a densifying plasma post-treatment after deposition of each sublayer.

While silicon carbide can be deposited using a variety of methods, in some embodiments, it is preferable to deposit sublayers and to perform plasma post-treatment in one PECVD apparatus. The thickness of each sublayer is typically less than about 100 Å, such as less than about 50 Å, to allow for more complete densification of material. The deposition can involve formation and plasma treatment of any number of sublayers to achieve suitable hardmask thickness. In some embodiments, at least 2 sublayers, such as at least 10 sublayers, or at least about 20 sublayers are deposited.

Figure 5A:
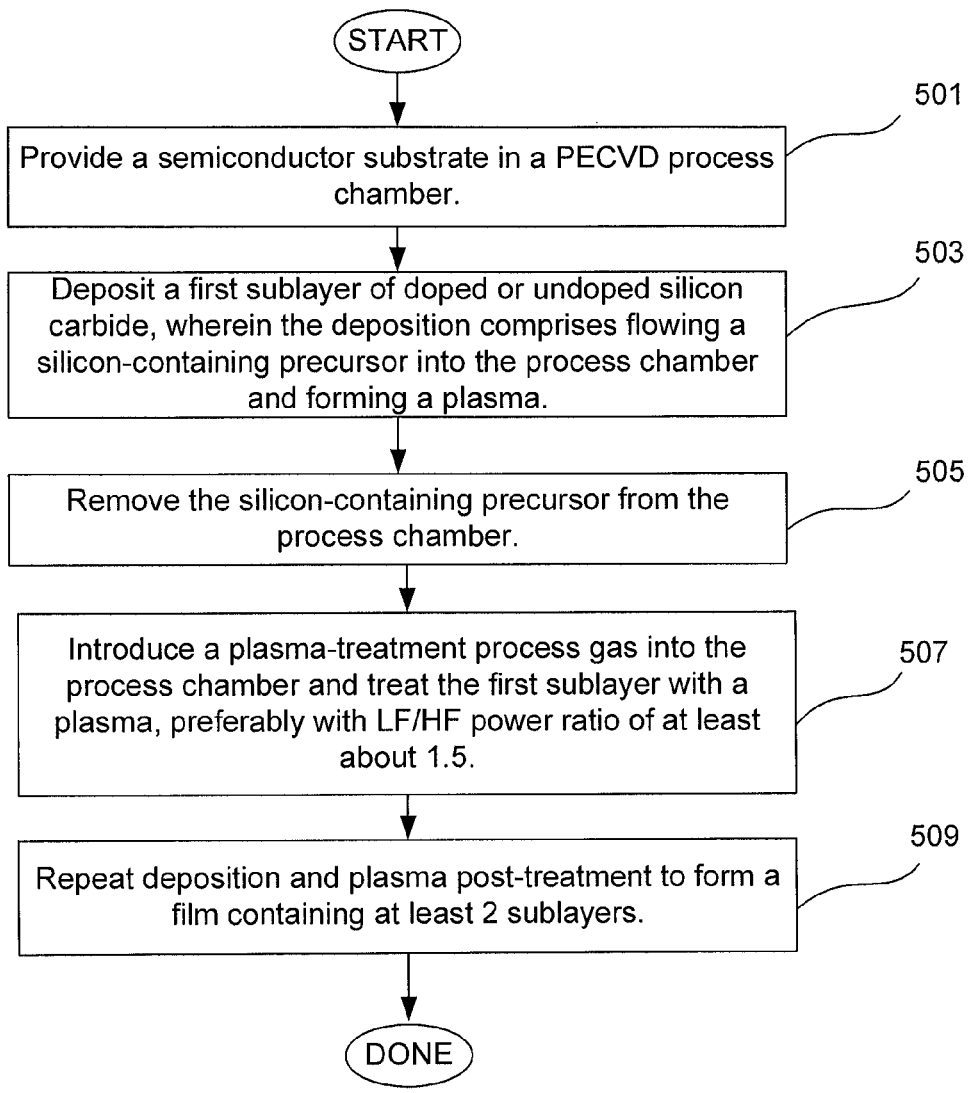
FIG. 5A is a process flow diagram for a method of depositing a silicon carbide hardmask, in accordance with an embodiment provided herein.

An exemplary process flow diagram for formation of multi-layer silicon carbide film is shown in FIG. 5A. In operation 501, a semiconductor substrate (e.g., a substrate having an exposed dielectric layer or an exposed polysilicon layer) is provided into a PECVD process chamber. The PECVD process chamber contains inlets for introduction of precursors, and a plasma generator. In some embodiments, dual-frequency RF plasma generator which has HF and LF generator components is preferred.

In operation 503, a first sublayer of doped or undoped silicon carbide is formed, wherein the deposition comprises flowing a silicon-containing precursor into the process chamber and forming a plasma. In one example, dual frequency plasma, where HF RF frequency is about 13.56 MHz and LF RF frequency is 400 kHz is used. The HF power density in this example is about 0.04-0.2 W/cm$^2$, and LF power density is about 0.17-0.6 W/cm$^2$.

A variety of silicon-containing precursors may be used, including organosilicon precursors, such as alkylsilanes, alkenylsilanes, and alkynylsilanes. In some embodiments, saturated precursors, such as tetramethylsilane, tri-iso-propylsilane, and 1,1,3,3-tetramethyl 1,3-disilacyclobutane, are preferred.

In some embodiments, silicon-containing precursor includes carbon, as in the examples above. In other embodiments, a carbon-free silicon-containing precursor (e.g., silane) and a separate carbon-containing precursor (e.g., hydrocarbon) may be used in the process gas. Further, in some embodiments, the process gas may include a hydrocarbon and an organosilicon precursor.

The silicon-containing precursor is typically introduced into the process chamber with a carrier gas, e.g., with an inert gas such as He, Ne, Ar, Kr or Xe. In some embodiments, $H_2$ can be included in the deposition process gas. In one example, a deposition process gas consists essentially of tetramethylsilane (flowed at a rate of about 500-2,000 sccm) and helium (flowed at a rate of about 3-5 slm).

If a layer of doped silicon carbide needs to be formed, a suitable dopant is added to the process gas. For example, $N_2$, $NH_3$, $N_2H_4$, an amine, or a different nitrogen-containing precursor can be added to the process gas to form a nitrogen-doped silicon carbide. Boron-containing precursor such as diborane, may be added to form a boron-containing silicon carbide. Phosphorus-containing precursor (e.g., $PH_3$) may be added to form a phosphorus doped silicon carbide.

After the plasma is ignited and silicon carbide sublayer has been formed to a desired thickness, in operation 505, the silicon-containing precursor is removed from the process chamber. This is accomplished in some embodiments by purging the process chamber with a purging gas, which may contain a gas selected from the group consisting of inert gases (e.g., He, Ar), $CO_2$, $N_2$, $NH_3$, $H_2$, and mixtures thereof. In some embodiments, He, Ar, $H_2$ or various mixtures thereof are preferred as a purging gas. In operation 507, after the silicon-containing precursor is completely removed, a plasma-treatment process gas (which may be same or different from the purging gas) is introduced into the process chamber and the first sublayer is treated with plasma, preferably under conditions in which LF/HF power ratio is at least about 1.5, such as at least about 2. In operation 509, deposition and plasma post-treatments are repeated to form a multi-layer film containing at least 2 sublayers, such as at least 10 sublayers. Plasma post-treatment of each sublayer is performed for a period of time that is needed for film densification, and may depend on the sublayer thickness. In some embodiments, plasma post-treatment is performed for about 5-25 seconds, such as about 8-15 seconds for each sublayer.

The resulting film was found to have structure and properties that are distinct from those of conventional silicon carbide films. It was unexpectedly discovered that multi-layer films prepared with multiple densifying plasma post-treatments, can possess high hardness and low stress simultaneously, which could not be achieved by conventional deposition methods.

Structural characterization of these films shows that Infra-Red (IR) spectra of such films have characteristically high Si—C/Si—H and Si—C/C—H peak ratios, where the ratios refer to the ratios of corresponding IR peak areas, centered at about 760-800 cm$^{-1}$ (Si—C), 2070-2130 cm$^{-1}$ (Si—H), and 2950-3000 cm$^{-1}$ (C—H).

In some embodiments the ratio of areas of Si—C peak in the IR spectrum relative to C—H is at least about 50 and the Si—C/Si—H ratio is at least about 20. Provided films also typically have a density of at least about 2 g/cm$^3$.

Figure 5B:
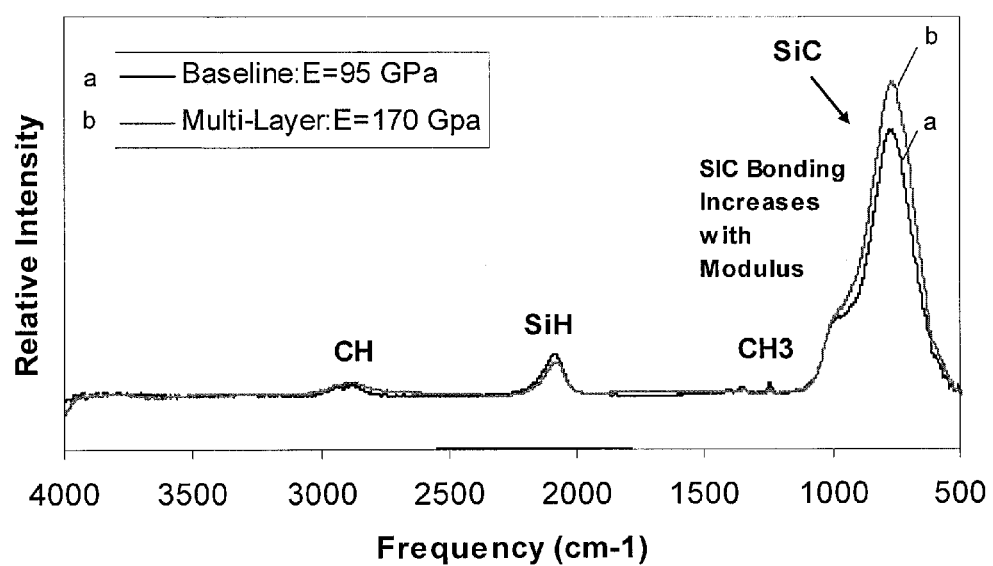
FIG. 5B provides an IR spectrum of a multi-layer silicon carbide film obtained using multiple densifying plasma post-treatments in comparison with a single-layer silicon carbide film. A more prominent Si—C peak is illustrated.

FIG. 5B shows IR spectra of a single-layer undoped silicon carbide film obtained without plasma post-treatment (curve a) and of a multi-layer undoped silicon carbide film obtained with multiple densifying plasma treatments (curve b). Single-layer film was deposited on a 300 mm wafer by flowing a process gas containing tetramethylsilane (at 1,000 sccm flow rate) and helium (at 3000 sccm flow rate) at a pressure of 2.1 Torr. Dual-frequency plasma at LF power density of about 0.25 W/cm$^2$ and HF power density of about 0.13 W/cm$^2$ was used during deposition. A multi-layer film was deposited under the same conditions for sublayer deposition, but additionally included plasma post-treatments after deposition of each sub-layer. Post-treatment involved flowing argon as a post-treatment gas into the process chamber at a rate of 3 slm at a chamber pressure of 2.1 Torr and forming a dual-frequency plasma at LF power density of about 0.25 W/cm$^2$ and HF power density of about 0.13 W/cm$^2$. The resulting single layer film was characterized by SiC/SiH area ratio of about 15. The resulting multi-layer film formed with densifying plasma treatments was characterized by SiC/SiH IR peak area ratio of about 24. The multi-layer film had Young's modulus of about 170 GPa and hardness of about 20.4 GPa, whereas the single-layer film had Young's modulus of about 95 GPa and hardness of only about 12 GPa. The single-layer film and the multi-layer film had stress values of −20 MPa and 179 MPa respectively.

Figure 5C:
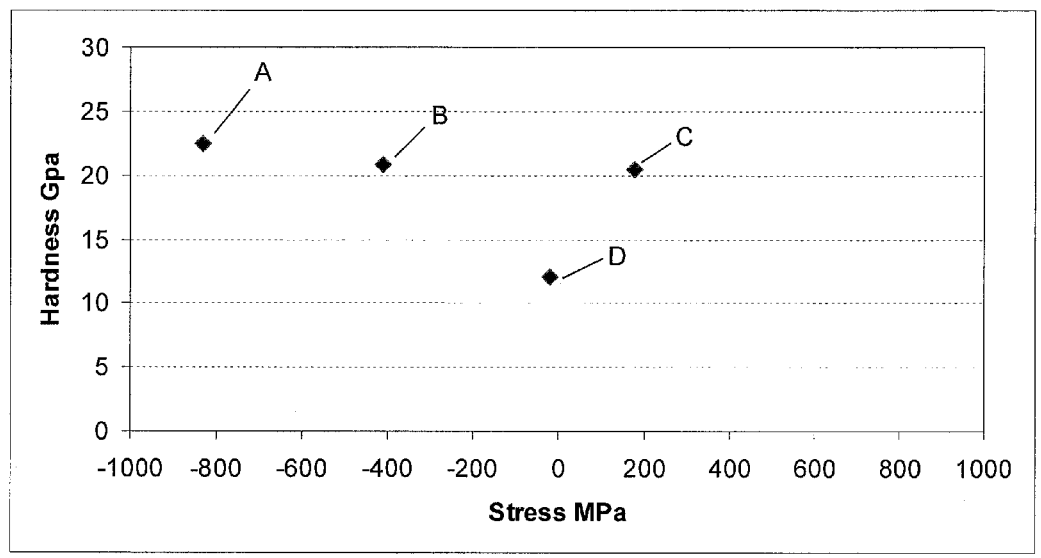
FIG. 5C is an experimental plot for stress and hardness characteristics of multi-layer silicon carbide films in comparison with single-layer films.
Figure 5D:
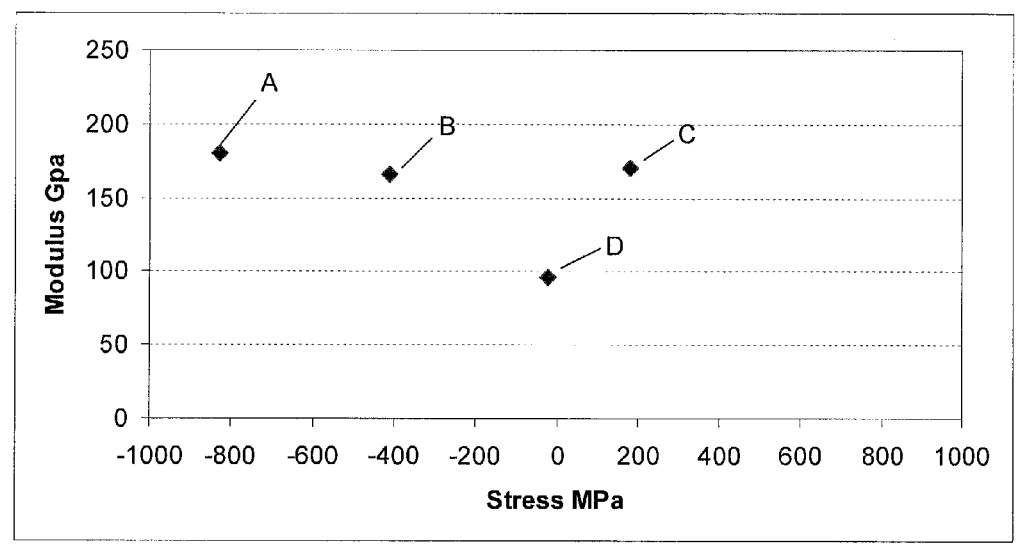
FIG. 5D is an experimental plot for stress and Young's modulus characteristics of multi-layer silicon carbide films in comparison with single-layer films.

FIG. 5C illustrates stress and hardness values for two multi-layer undoped silicon carbide films prepared using densifying plasma post-treatments and for two single-layer undoped silicon carbide films prepared without post-treatment. FIG. 5D illustrates stress and Young's modulus values for the same films. Table 1 summarizes deposition and post-treatment conditions for the films.

TABLE 1

| Film | Deposition | Post-Treatment | Stress, MPa | Hardness, GPa | Modulus, GPa |
|---|---|---|---|---|---|
| Film A | LF = 0.35 W/cm$^2$ HF = 0.13 W/cm$^2$ | No | −830 | 22.4 | 180 |

TABLE 1-continued

| Film | Deposition | Post-Treatment | Stress, MPa | Hardness, GPa | Modulus, GPa |
|---|---|---|---|---|---|
| Film B | LF = 0.53 W/cm² HF = 0.13 W/cm² | LF = 0.53 W/cm² HF = 0.13 W/cm² | −412 | 20.86 | 166 |
| Film C | LF = 0.23 W/cm² HF = 0.13 W/cm² | LF = 0.23 W/cm² HF = 0.13 W/cm² | 179 | 20.4 | 170 |
| Film D | LF = 0.23 W/cm² HF = 0.13 W/cm² | No | −20 | 12 | 96 |

All films were prepared using a mixture of tetramethylsilane and helium as a deposition process gas at a pressure of about 2 Torr. Dual-frequency plasma generation was used in all cases for deposition. The power densities for HF and LF plasma are listed in the table, where the power density is calculated by dividing the power by substrate area. Films A and D were single-layer films prepared without plasma post-treatment. It can be seen that these films do not possess high hardness and low stress at the same time. For example, Film A, while being relatively hard (22.4 GPa), has a very high compressive stress of −830 MPa. Film D, while having small stress (−20 MPa), possesses only moderate hardness of 12 GPa.

Films B and C are multi-layer films, where plasma post-treatment was performed after deposition of each silicon carbide sublayer. Argon was used as plasma treatment gas at a pressure of about 2 Torr. Dual-frequency plasma generation was used for plasma post-treatment. The power densities for HF and LF plasma are listed in the table. Unexpectedly, multi-layer films were found to have both high hardness (and/or modulus) and low stress. For example, Film B has a hardness of 20.86 GPa and a stress of −412 MPa (which is more than 2 times lower than stress of Film A). Further, multi-layer Film C has a high hardness of 20.4 GPa and a tensile stress of 179 MPa. The hardness of Film C is more than 1.5 times greater than the hardness of film D. It is noted that, except for plasma post-treatment, Films C and D are deposited under identical conditions. It can be seen that plasma post-treatment makes the films harder without unacceptably increasing compressive stress of the films.

In some embodiments, it is preferable to perform post-treatment of silicon carbide sub-layers using dual frequency plasma where LF power is greater than HF power, such as LF/HF power ratio is at least about 1.5, or at least about 2. Unexpectedly, increase in the ratio of LF/HF powers used during post-treatment, improves properties of the obtained films. Increased LF/HF power ratio increases refractive index of the obtained films, a parameter, which positively correlates with film hardness. In some embodiments, multi-layer silicon carbide films having refractive index of at least about 2.25, such as at least about 2.30 are provided. Increase in refractive index of the film with increasing LF/HF power ratio is illustrated in Table 2.

TABLE 2

| Film ID | Post-treatment HF power per station, W | Post-treatment LF power per station, W | Refractive Index |
|---|---|---|---|
| 1 | 114 | 211 | 2.3021 |
| 2 | 325 | 0 | 2.2308 |
| 3 | 114 | 111 | 2.2527 |

Boron-Containing Hardmask Films

In another aspect, boron-containing hardmask films are provided. Boron-containing films include a material selected from the group consisting of $Si_xB_yC_z$, $Si_xB_yN_z$, $Si_xB_yC_zN_w$, $B_xN_y$, and $B_xC_y$. In some embodiments, these materials are engineered to have high hardness (e.g., hardness of at least about 12 GPa, preferably at least about 16 GPa) and low stress (e.g., stress of between about −600 and 600 MPa, preferably of between about −300 and 300 MPa). Advantageously, in some embodiments, boron-containing films having no compressive stress, such as films with very low tensile stress (e.g., between about 0-300 MPa) are provided. Further, boron-containing films are typically more hydrophilic than undoped silicon carbide films, and can be more easily removed by CMP (e.g., using acidic slurries containing hydrogen peroxide). In general, boron-containing hardmasks can be prepared by a variety of methods, such as by CVD-based techniques and by PVD-based techniques. In some embodiments, PECVD is preferred for preparation of a boron-containing hardmask.

Referring to FIG. 6, an exemplary process flow for using a boron-containing hardmask in back-end processing. The process starts in 601 by providing a semiconductor substrate comprising an exposed dielectric layer in a PECVD process chamber. The dielectric layer may be, for example, an ultra-low k dielectric layer (e.g., with k less than about 2.8, such as less than about 2.4) or a buffer dielectric layer with higher dielectric constant.

In operation 601 a high-hardness low-stress boron-containing hardmask film selected from the group consisting of $Si_xB_yC_z$, $Si_xB_yN_z$, $Si_xB_yC_zN_w$, $B_xN_y$, and $B_xC_y$ is deposited. The deposition is performed by flowing a process gas comprising appropriate precursors into the process chamber and forming a plasma. In some embodiments dual frequency plasma is preferred. In some embodiments, particularly good film parameters are obtained when power density for LF plasma is greater than power density for HF plasma, e.g., at LF/HF power ratios of at least about 1.5, such as at least about 2.

After the film has been deposited, the dielectric is patterned in 605, to form trenches and/or vias, e.g., as was described with reference to FIGS. 1A-1K. Boron-containing films can serve as hardmasks during dry etch of dielectric with RIE. Next, after the vias and/or trenches have been formed in the dielectric, they are filled with metal in operation 607. Next, the boron-containing hardmask is removed in 609 by CMP, typically following the removal of metal overburden.

PECVD deposition of $Si_xB_yC_z$ can be accomplished by using a process gas containing a silicon-containing precursor, a boron-containing precursor, and a carbon-containing precursor. One or more of these precursors can be the same molecule. For example, tetraalkylsilane can function both as a carbon-containing and as a silicon-containing precursor. Diborane is typically used as a boron-containing precursor, alkylsilanes (e.g., tetramethylsilane), alkenylsilanes, and alkynylsilanes can be used as silicon and carbon-containing precursors. Further, saturated and unsaturated hydrocarbons $(C_xH_y)$ can be used as carbon-containing precursors, and $SiH_4$ can be used as a silicon-containing precursor.

Deposition of $Si_xB_yC_zN_w$ can be accomplished by forming a plasma in a process gas comprising a silicon-containing precursor, a boron-containing precursor, a carbon-containing precursor (as described above) and a nitrogen-containing precursor. Nitrogen-containing precursors can include ammonia, hydrazine, $N_2$ and mixtures thereof. Further nitrogen-containing precursor may be the same as carbon-containing precursor and may include amines, such as monoalkylamines, dialkylamines, and trialkylamines. Nitrogen-containing precursor may be the same as boron-containing precursor and may include trimethylborazine. Nitrogen-containing precursor further may be the same as silicon-containing precursor, e.g., in a silazane.

Deposition of $Si_xB_yN_w$ can be accomplished by forming a plasma in a process gas comprising a silicon-containing precursor (e.g., $SiH_4$), a boron-containing precursor (e.g., diborane), and a nitrogen-containing precursor (e.g., ammonia, hydrazine, $N_2$ and their various mixtures).

$B_xN_y$ can be deposited using a process gas comprising a boron-containing precursor (e.g., diborane) and a nitrogen-containing precursor (e.g., ammonia, hydrazine, $N_2$, and their mixtures).

$B_xC_y$ can be deposited using a process gas comprising a boron-containing precursor (e.g., diborane) and a carbon-containing precursor (e.g., a saturated or unsaturated hydrocarbon. An inert carrier gas, such as helium or argon is typically a part of the process gas used during deposition of these boron-containing films. In some embodiments, $H_2$ is also included in the process gas.

Figure 6A:
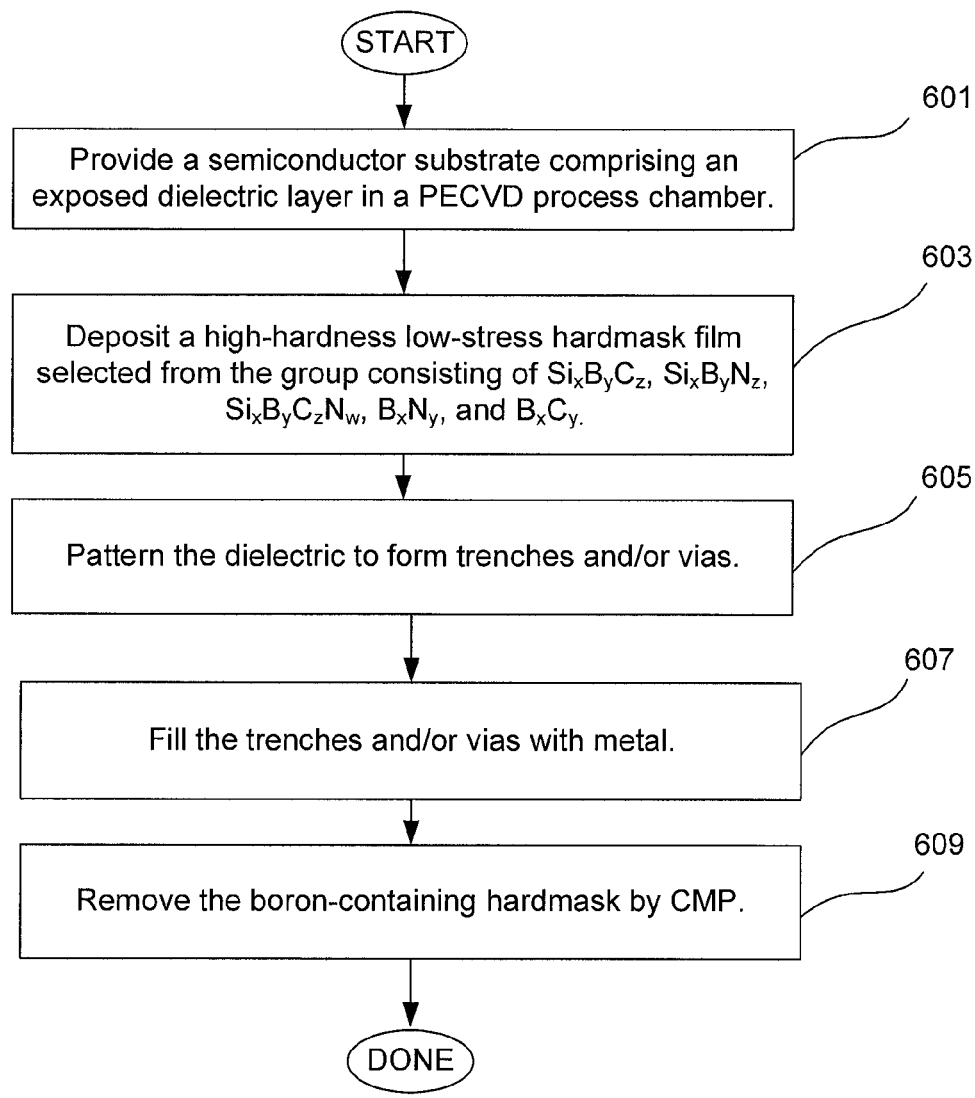
FIG. 6A is a process flow diagram for an exemplary processing method which employs boron-containing hardmask in accordance with an embodiment provided herein.
Figure 6B:
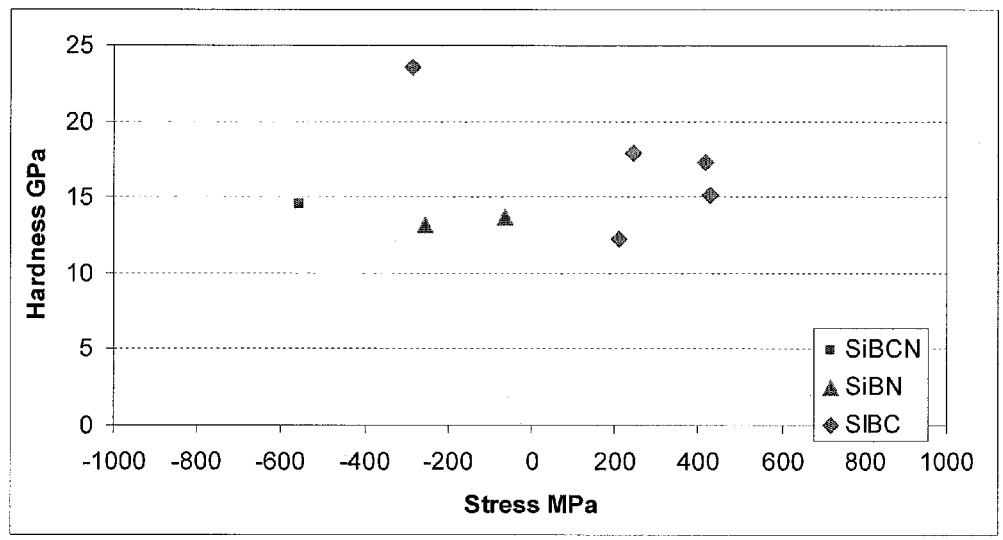
FIG. 6B is an experimental plot for stress and hardness characteristics of boron-containing films suitable for hardmask applications.
Figure 6C:
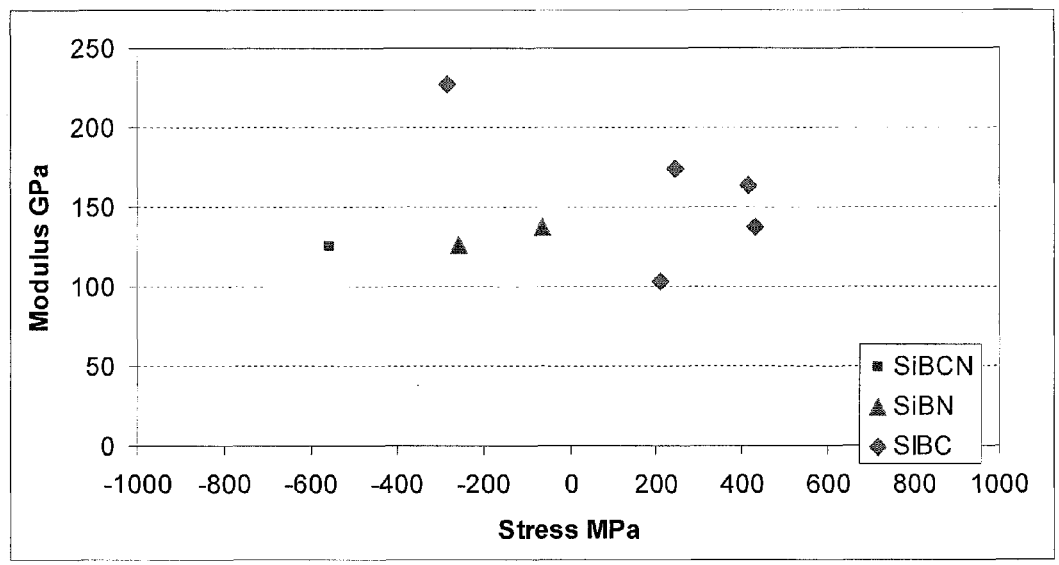
FIG. 6C is an experimental plot for stress and Young's modulus characteristics of boron-containing films suitable for hardmask applications.

FIG. 6B illustrates hardness and stress parameters for various PECVD-deposited $Si_xB_yC_z$, $Si_xB_yN_z$, $Si_xB_yC_zN_w$ films. FIG. 6C illustrates Young's modulus and stress parameters for the same films. Deposition conditions and properties of obtained films are listed in Table 3.

TABLE 3

| Film | Process gas | $B_2H_6$/4MS Flow rate ratio | Stress, MPa | Hardness, GPa | Modulus, GPa |
|---|---|---|---|---|---|
| 1. $Si_xB_yC_zN_w$ | $B_2H_6$, 4MS, $NH_3$, $N_2$ | | −555 | 14.5 | 125 |
| 2. $Si_xB_yN_z$ | $B_2H_6$, $SiH_4$, $NH_3$, $N_2$ | | −256 | 13.12 | 126 |
| 3. $Si_xB_yN_z$ | $B_2H_6$, $SiH_4$, $NH_3$, $N_2$ | | −65 | 13.72 | 138 |
| 4. $Si_xB_yC_z$ | $B_2H_6$, 4MS, He | 3.5 | 416 | 17.3 | 163 |
| 5. $Si_xB_yC_z$ | $B_2H_6$, 4MS, He, $H_2$ | 3.5 | −284 | 23.54 | 227 |
| 6. $Si_xB_yC_z$ | $B_2H_6$, 4MS, He | 3.5 | 246 | 17.9 | 174 |
| 7. $Si_xB_yC_z$ | $B_2H_6$, 4MS, He | 0.5 | 211 | 12.29 | 103 |
| 8. $Si_xB_yC_z$ | $B_2H_6$, 4MS, He | 1.5 | 430 | 15.15 | 138 |

All films were deposited on a 300 mm wafer at a pressure ranging from about 2 to about 4 torr, using dual frequency plasma, where HFRF power density ranged from about 0.08 to about 0.30, and LFRF power density ranged from about 0.10 to about 0.24 W/cm$^2$.

In one embodiment $Si_xB_yC_z$ film is deposited using a process gas consisting essentially of $B_2H_6$, tetramethylsilane (4MS), and He. $B_2H_6$ flow rate can be in the range of between about 2,000-4,000 sccm, preferably between about 3,500-4,000 sccm, while flow rate of tetramethylsilane can range between about 1,000-1,500 sccm. A carrier gas (e.g., He) flow rate of between about 3-8 slm is preferably used. Dual frequency plasma at HFRF power density of between about 0.04-0.26 W/cm$^2$ and LFRF power density of between about 0.14-0.53 W/cm$^2$ is used in some embodiments.

It was unexpectedly discovered that the hardness of obtained films is highly dependent on the ratio of $B_2H_6$ and tetramethylsilane (4MS). Preferably $B_2H_6$/4MS flow rate ratio of at least about 2, e.g., of at least about 3 is used in order to obtain high-hardness boron-rich films.

Figure 6D:
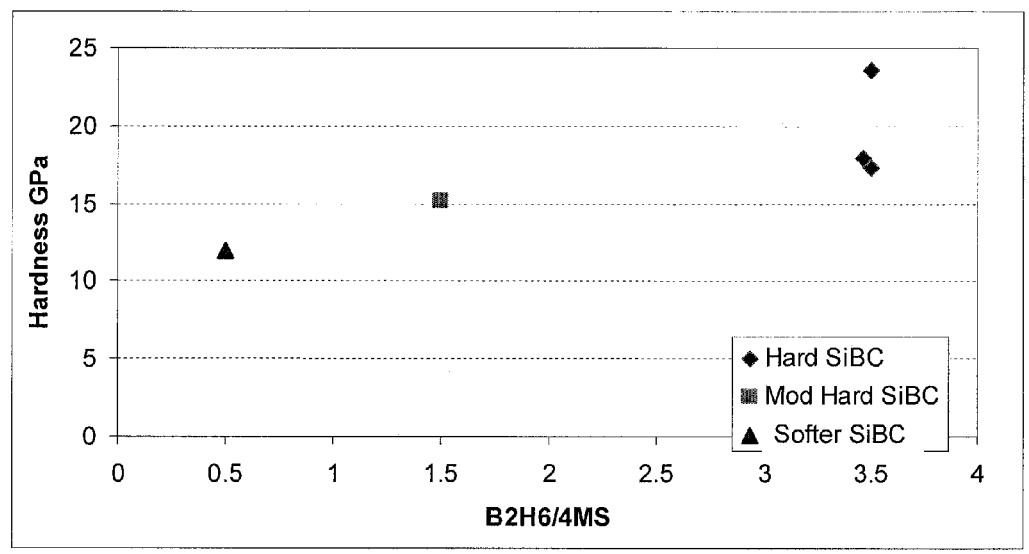
FIG. 6D is an experimental plot illustrating dependence of $Si_xB_yC_z$ film hardness on the $B_2H_6$/tetramethylsilane flow rate ratio used during PECVD.

FIG. 6D illustrates hardness of $Si_xB_yC_z$ films as a function of $B_2H_6$/4MS flow rate ratio. It can be seen that hardness can be increased by about 2-fold by raising the flow-rate ratio from about 0.5 to about 3.5. Corresponding hardness and stress values for different flow-rate ratios are shown in Table 3.

Structurally, films with high hardness and high Young's modulus are characterized by high B—C bond content. High-hardness films having the ratio of BC/[BC+SiC] IR peak areas of at least about 0.35, are preferred in some embodiments. The ratio refers to the ratio of corresponding IR peak areas, centered at about 1120-1160 cm$^{-1}$ (B—C), and 760-800 cm$^{-1}$ (Si—C). [

Figure 6E:
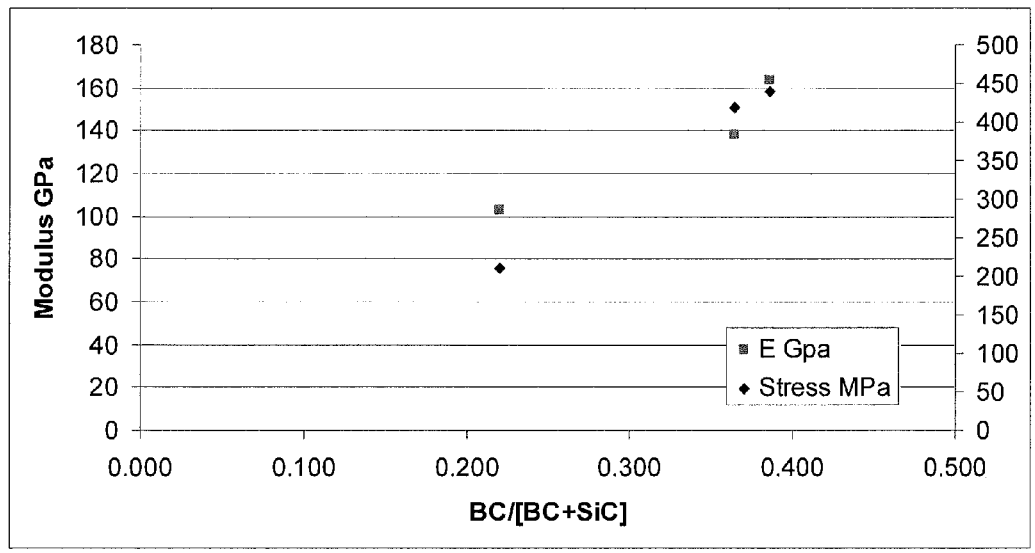
FIG. 6E is an experimental plot illustrating dependence of Young's modulus and stress parameters of $Si_xB_yC_z$ films on BC/[BC+SiC] IR peak area ratio.

FIG. 6E illustrates the dependence of Young's modulus and stress parameters of various $Si_xB_yC_z$ films as a function of BC/[BC+SiC] area ratio. It can be seen that the films having BC/[BC+SiC] of less than about 0.3 are significantly softer than films with higher B—C bond content. Table 4 summarizes obtained data on three $Si_xB_yC_z$ films. All three films were deposited using the process gas consisting of $B_2H_6$ (flow rate varied from 500 to 3500 sccm), 4MS (1,000 sccm flow rate), and He (3,000 sccm flow rate) using dual frequency plasma at HFRF power density of about 0.12 W/cm$^2$ and LFRF power density of about 0.22 W/cm$^2$ at a pressure of 2.1 Torr. The hardness, stress, and Young's modulus parameter as a function of B—C content are illustrated in Table 4.

TABLE 4

| Film | BC/[BC + SiC] | Stress, MPa | Hardness, GPa | Modulus, GPa |
|---|---|---|---|---|
| 1. $Si_xB_yC_z$ | 0.386 | 439 | 17.3 | 163 |
| 2. $Si_xB_yC_z$ | 0.22 | 211 | 12.29 | 103 |
| 3. $Si_xB_yC_z$ | 0.364 | 418 | 15.15 | 138 |

In some embodiments, it is preferable to deposit $Si_xB_yC_z$ using dual frequency plasma where LF power is greater than HF power, such as LF/HF power ratio is at least about 1.5, at least about 2, e.g., at least about 3. It was discovered that increase in the ratio of LF/HF powers used during deposition improves properties of the obtained films. Increased LF/HF power ratio increases refractive index of the obtained films, which positively correlates with film hardness. In some embodiments, $Si_xB_yC_z$ films having refractive index of at least about 2.3, such as at least about 2.5, e.g., at least about 2.6 are provided. Increase in refractive index of the film with increasing LF/HF power ratio is illustrated in Table 5.

TABLE 5

| Film ID | LF/HF power ratio | Refractive Index |
|---|---|---|
| I. $Si_xB_yC_z$ | 1.86 | 2.518 |
| II. $Si_xB_yC_z$ | 4.33 | 2.5714 |
| III. $Si_xB_yC_z$ | 3.05 | 2.6131 |
| IV. $Si_xB_yC_z$ | 0.81 | 2.3382 |

In $Si_xB_yN_z$ films, an important structural characteristic of the film, is the content of B—N bonds, which is quantified using the BN/[BN+SiN] ratio of areas of peaks in the IR spectrum, where the ratio refer to the ratio of corresponding IR peak areas, centered at about 1400 cm$^{-1}$ (B—N), and 820-850 cm$^{-1}$ (Si—N).

Figure 6F:
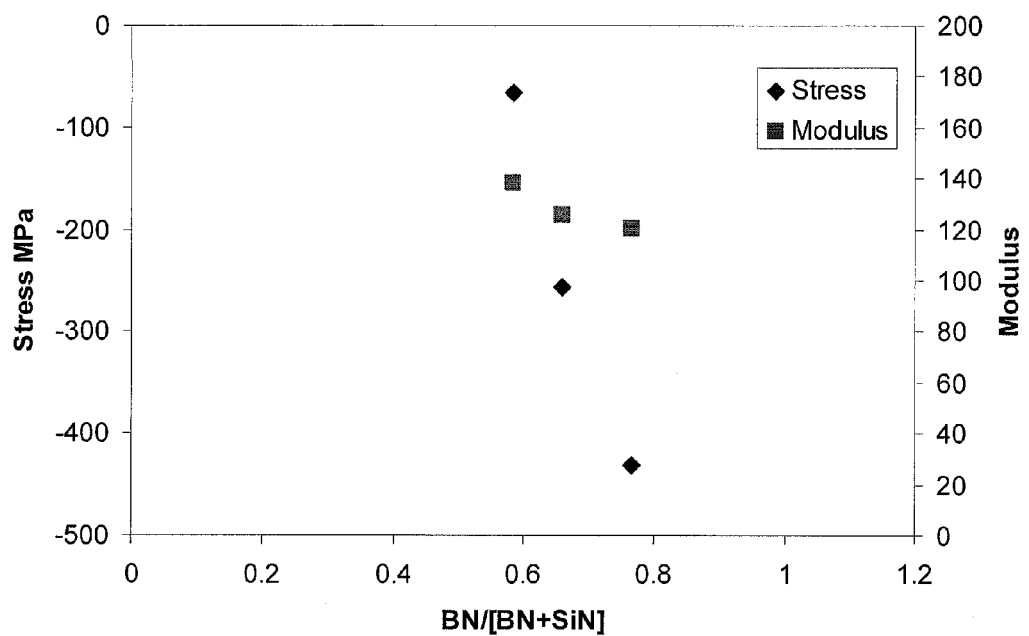
FIG. 6F is an experimental plot illustrating dependence of Young's modulus and stress parameters of $Si_xB_yN_z$ films on BN/[BN+SiN] IR peak area ratio.

FIG. 6F shows that both stress and Young's modulus are highly dependent on this parameter. Specifically compressive stress rapidly increases with increasing B—N bond content. In some embodiments, $Si_xB_yN_z$ films with BN/[BN+SiN] of less than about 0.7, such as less than about 0.6 are preferred. The B—N bond content can be adjusted as needed by appropriately modifying the flow rates of silicon-containing and boron-containing precursors. Table 6 illustrates film properties for films having different BN/[BN+SiN] ratios.

TABLE 6

| Film | Process gas | BN/ [BN + SiN] | Stress, MPa | Hardness, GPa | Modulus, GPa |
|---|---|---|---|---|---|
| 1. $Si_xB_yN_z$ | $B_2H_6$ (4125 sccm), $SiH_4$ (300 sccm), $NH_3$ (825 sccm), $N_2$ (16,500 sccm) | 0.77 | −431 | 12.89 | 120 |
| 2. $Si_xB_yN_z$ | $B_2H_6$ (4125 sccm), $SiH_4$ (75 sccm), $NH_3$ (825 sccm), $N_2$ (16,500 sccm) | 0.66 | −256 | 13.12 | 126 |
| 3. $Si_xB_yN_z$ | $B_2H_6$ (4125 sccm), $SiH_4$ (150 sccm), $NH_3$ (825 sccm), $N_2$ (16,500 sccm) | 0.59 | −65 | 13.72 | 138 |

Figure 6G:
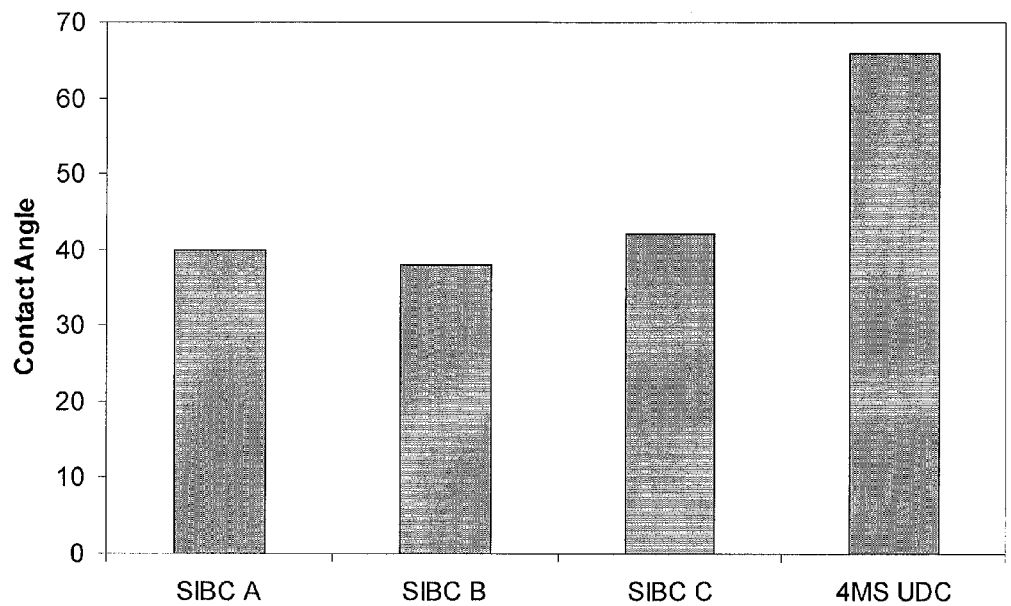
FIG. 6G is an experimental plot illustrating performance of $Si_xB_yC_z$ films in a contact angle hydrophobicity test in comparison with undoped silicon carbide film. Relatively more hydrophilic nature of $Si_xB_yC_z$ films is illustrated.

As it was previously mentioned, boron-containing films are well suited for hardmask application. One of distinct advantages of boron-containing films is their hydrophilic nature, and ease of removal by CMP. FIG. 6G illustrates hydrophilicity of various $Si_xB_yC_z$ films in comparison with undoped silicon carbide film using contact angle test, in which a drop of water is placed on the film. A contact angle of the drop on the film is measured, with lower contact angle corresponding to more hydrophilic films. $Si_xB_yC_z$ films 4-6 listed in Table 3 were tested, and contact angles of 38-42° were obtained. In contrast, undoped silicon carbide film is significantly more hydrophobic, as evidenced by a significantly higher contact angle of 66°.

Germanium Nitride Hardmask Films

In another aspect, $GeN_x$ hardmask films are provided. These films in some embodiments are characterized by high Young's modulus of at least about 100 GPa, such as at least about 130 GPa and high density (e.g., density of greater than about 4 g/cm$^3$). $GeN_x$ films can be used as hardmasks in a variety of back-end and front-end processing schemes, are sufficiently transparent at wavelengths used for pattern alignment with lasers, and can be easily removed from the substrate after use by CMP or wet etching techniques.

In some embodiments, germanium-rich $GeN_x$ hardmask films are preferably used. Such germanium-rich films have germanium concentration of at least about 60 atomic %, such as at least about 70 atomic %, e.g., at least about 75 atomic % excluding hydrogen. High germanium content makes the germanium nitride film more susceptible to CMP and wet etching removal after the film has been used in patterning. Removal, in some embodiments, is accomplished by contacting the hardmask with a composition comprising hydrogen peroxide in a CMP or a wet etching operation. For example, acidic CMP slurries containing hydrogen peroxide may be used.

In one example, $GeN_x$ hardmask film having germanium concentration of about 79 atomic % germanium, Young's modulus of about 144 GPa and a density of about 4.4 g/cm$^3$ was prepared.

Germanium nitride hardmasks generally can be prepared using a variety of CVD and PVD techniques, of which PECVD will be described as an illustrative example. Making reference to the back-end process flow diagram shown in FIG. 7, the process starts in 701 by providing a semiconductor substrate comprising an exposed dielectric layer in a PECVD process chamber. In operation 703, a $GeN_x$ hardmask film with a germanium content of at least about 60 atomic % is deposited. Deposition is performed by introducing a process gas comprising a germanium-containing precursor (e.g., germane) and a nitrogen-containing precursor (e.g., $NH_3$, $N_2$, $N_2H_4$, and various mixtures thereof) into the process chamber and forming a plasma to deposit a germanium nitride layer. The deposition process gas may optionally include an inert gas, such as helium or argon. The ratio of flow rates of a nitrogen-containing precursor and of a germanium-containing precursor is selected such as to form a germanium-rich germanium nitride film. In one example, where the precursors are germane and ammonia, the ratio of germane to ammonia of at least about 0.05 is used.

In one illustrative example, a $GeN_x$ hardmask is prepared on a 300 mm wafer by flowing a process gas consisting essentially of germane (at a flow rate of between about 50-100 sccm), $NH_3$ (at a flow rate of between about 600-1200 sccm) and $N_2$ (at a flow rate of about 12 slm) into the process chamber and forming a dual-frequency plasma to deposit the germanium nitride film on a substrate at a temperature of between about 350-450° C., where the temperature refers to the temperature at the pedestal. The pressure during deposition in this illustration is between about 2.5-4 Torr. The HF RF component at a frequency of about 13.56 MHz (at a power density of about 0.18 W/cm$^2$) and LF RF component at a frequency of about 400 kHz (at a power density of about 0.23 W/cm$^2$) is used in this illustrative deposition process. In some embodiments it is preferable to use LF component at a greater power density than HF component.

Figure 7:
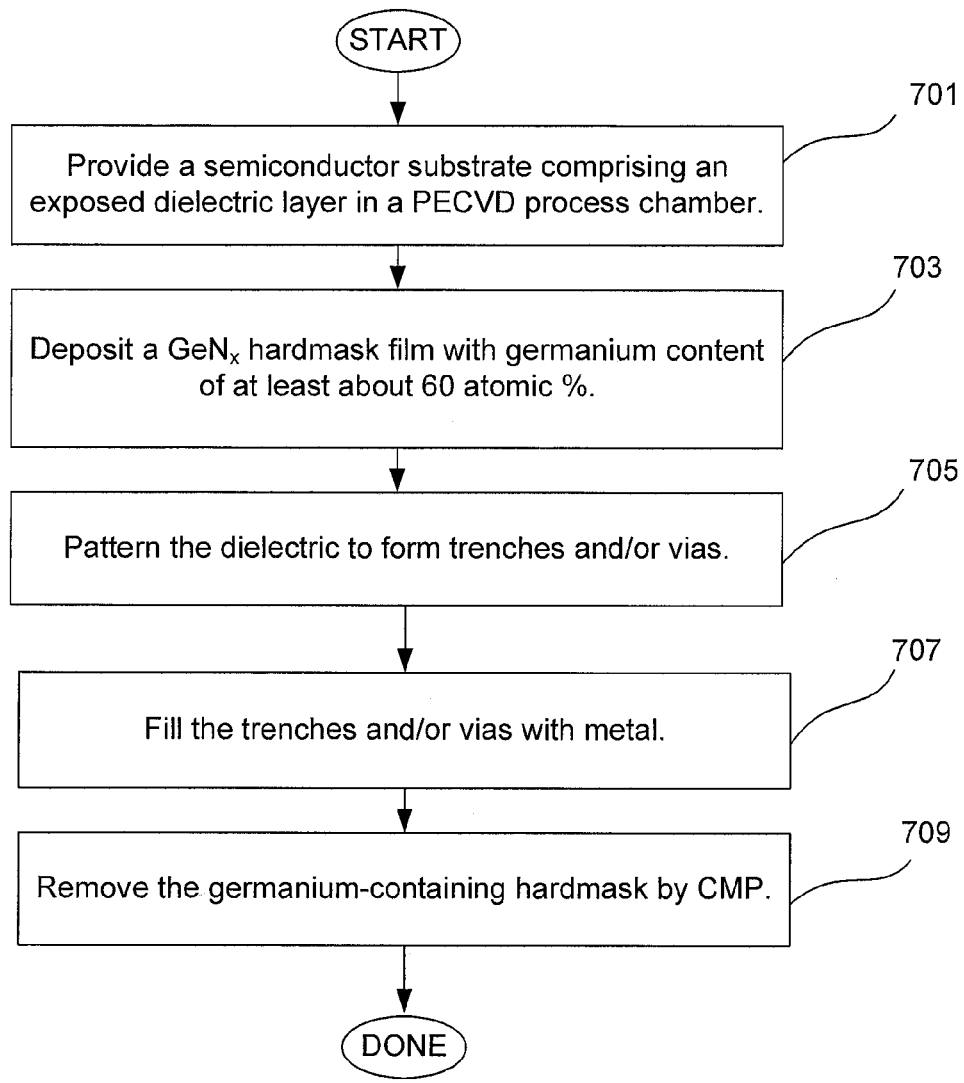
FIG. 7 is a process flow diagram for an exemplary processing method which employs $GeN_x$ hardmask in accordance with an embodiment provided herein.

Referring again to the process flow diagram of FIG. 7, after the germanium nitride film has been deposited, the dielectric is patterned in operation 707 to form trenches and/or vias, e.g., as described in FIGS. 1A-1K. The germanium nitride hardmask can be used during dry etch patterning, such as during Reactive Ion Etching (RIE) of dielectric. For example, vias and/or trenches can be etched in the dielectric in the presence of exposed $GeN_x$ hardmask by contacting the substrate having exposed hardmask and dielectric layers, with a plasma using a process gas comprising $C_xF_y$ (e.g., $CF_4$), inert gas (e.g., Ar) and an oxidizer (e.g., $O_2$). Other dry etches, such as plasma etching with a process gas comprising $Cl_2$ and $N_2$ may be used.

After the dielectric has been patterned, the vias and/or trenches are filled with metal in operation 707. For example, copper can be deposited by electroplating, into the recessed features. Next in operation 709, the hardmask is removed by CMP. For example, this can be accomplished during CMP-removal of copper overburden and diffusion barrier material. In some embodiments a CMP slurry having acidic pH, and comprising a peroxide (such as hydrogen peroxide) is used for removal of $GeN_x$ hardmask. In other embodiments, $GeN_x$ hardmask film can be removed by wet etching (e.g., with solutions comprising $H_2SO_4$ and $H_2O_2$ that can be present in a 3:1 ratio)

The process flow diagram in FIG. 7 illustrates a back-end processing scheme. $GeN_x$ film can be also used as a hardmask in front-end processing. Further, germanium nitride film can serve as a hardmask during wet etching, e.g., during patterning of silicon oxide-based materials with fluoride-containing wet etching chemistry.

Apparatus

The hardmask materials described herein generally can be deposited in different types of apparatus, including CVD and PVD apparatuses. In a preferred embodiment, the apparatus is a PECVD apparatus which includes HFRF and LFRF power source. Examples of suitable apparatuses include SEQUEL® and VECTOR® tools commercially available from Novellus Systems, Inc. located in San Jose, Calif.

Figure 8:
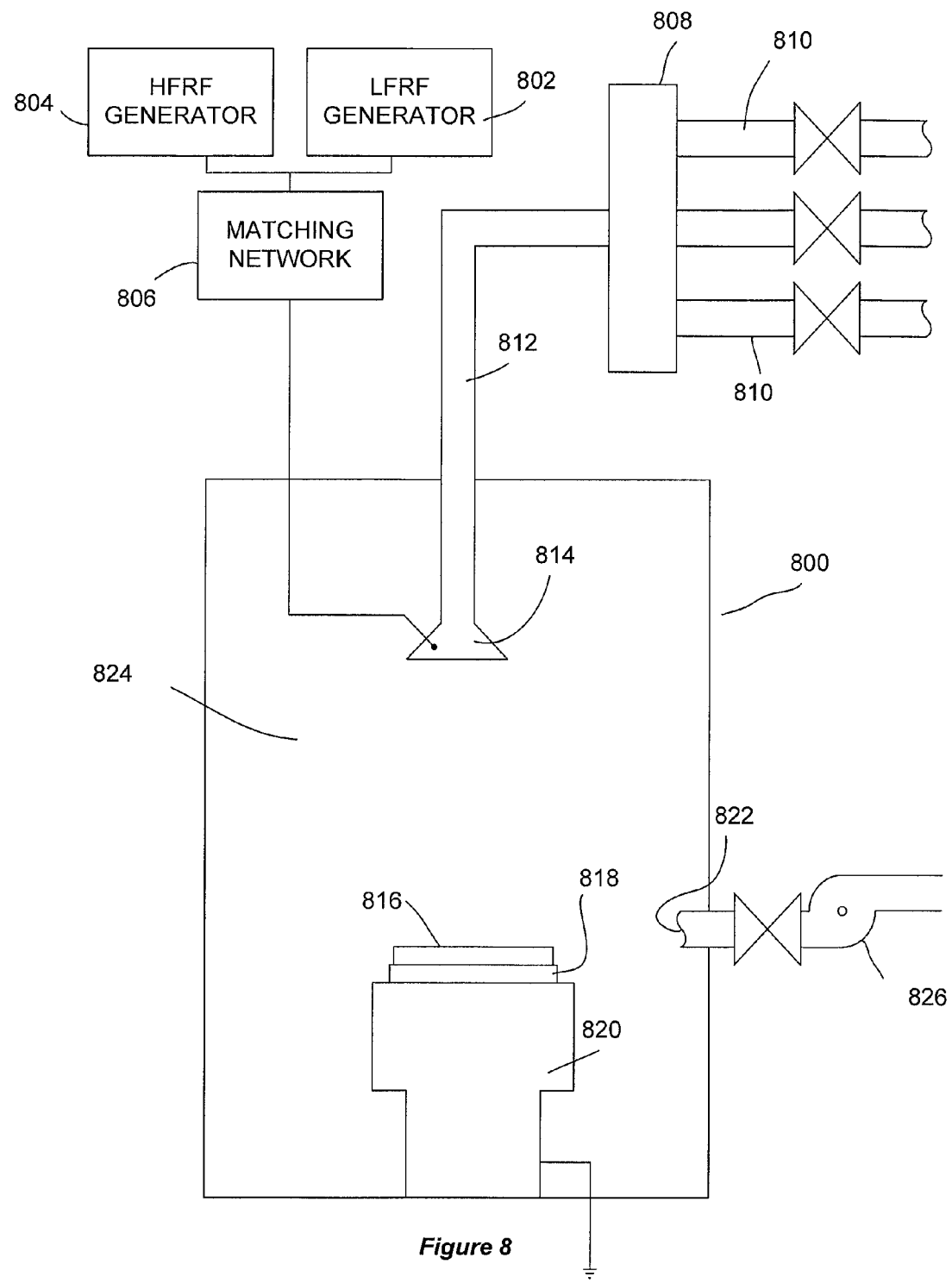
FIG. 8 is a schematic representation of a PECVD apparatus capable of using low frequency (LF) and high frequency (HF) radio frequency plasma sources that can be used for depositing hardmask films in accordance with some embodiments of present invention

Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In some embodiments, a wafer undergoing hardmask layer deposition is transferred from one station to another within the reactor during the process. While in process, each wafer is held in place by a pedestal, wafer chuck and/or other wafer holding apparatus. For operations in which the wafer is to be heated, the apparatus may include a heater such a heating plate FIG. 8 provides a simple block diagram depicting various reactor components of a suitable PECVD reactor arranged for implementing the present invention. As shown, a reactor 800 includes a process chamber 824, which encloses other components of the reactor and serves to contain the plasma generated by a capacitor type system including a showerhead 814 working in conjunction with a grounded heater block 820. A high-frequency RF generator 804 and a low-frequency RF generator 802 are connected to a matching network 806 that, in turn is connected to showerhead 814.

Within the reactor, a wafer pedestal 818 supports a substrate 816. The pedestal typically includes a chuck, a fork, or lift pins to hold and transfer the substrate during and between the deposition reactions. The chuck may be an electrostatic chuck, a mechanical chuck or various other types of chuck as are available for use in the industry and/or research.

The process gases are introduced via inlet 812. Multiple source gas lines 810 are connected to manifold 808. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 824 via an outlet 822. A vacuum pump 826 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Figure 9:
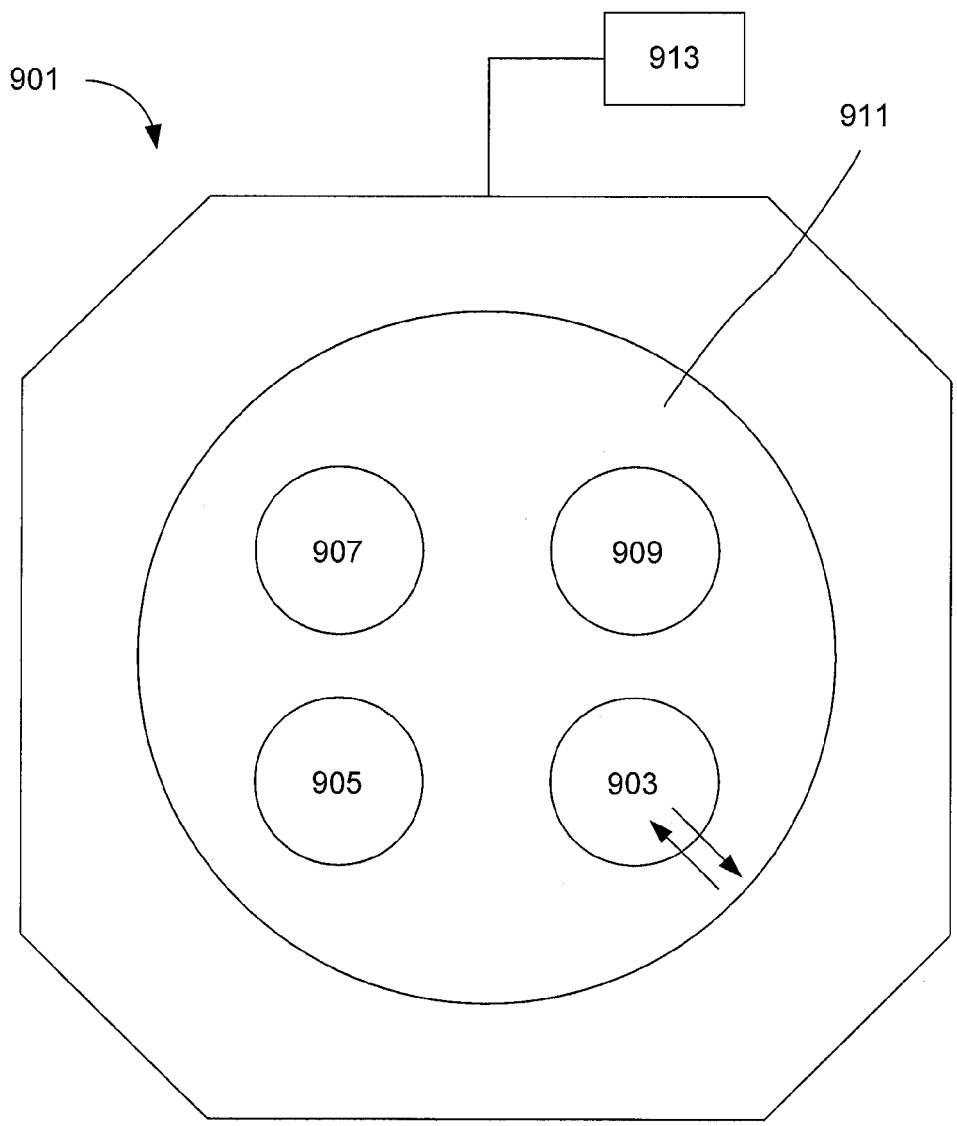
FIG. 9 is a schematic representation of a multi-station PECVD apparatus suitable for forming hardmask films in accordance with some embodiments of present invention.

In one of the embodiments a multi-station apparatus may be used for depositing a hardmask layer. The multi-station reactor allows one to run different or same processes concurrently in one chamber environment, thereby increasing the efficiency of wafer processing. An example of such an apparatus is depicted in FIG. 9. A schematic presentation of top view is shown. An apparatus chamber 901 comprises four stations 903-909. In general, any number of stations is possible within the single chamber of a multi-station apparatus. Station 903 is used for loading and unloading of the substrate wafers. Stations 903-909 may have the same or different functions and, in some embodiments, can operate under distinct process conditions (e.g., under different temperature regimes).

In some embodiments, the entire hardmask layer is deposited in one station of an apparatus. In other embodiments, a first portion of the hardmask layer is deposited in a first station, the wafer is then transferred to a second station, where the second portion of the same hardmask layer is deposited, and so on, until the wafer returns back to the first station and exits the apparatus.

In one embodiment, deposition of sublayers of silicon carbide, and plasma post-treatment are performed in one of the stations of the apparatus. In other embodiments, deposition of sublayers is performed in one or more dedicated stations, while plasma post-treatment is performed at one or more different stations.

In one embodiment, stations 903, 905, 907, and 909 all serve for deposition of a hardmask layer. An indexing plate 911 is used to lift the substrates off the pedestals and to accurately position the substrates at the next processing station. After the wafer substrate is loaded at station 903, it is indexed to stations 905, 907, and 909 in succession, wherein a portion of a hardmask layer is deposited at each station. The processed wafer is unloaded at station 903, and the module is charged with a new wafer. During normal operation, a separate substrate occupies each station and each time the process is repeated the substrates are moved to new stations. Thus, an apparatus having four stations 903, 905, 907, and 909 allows simultaneous processing of four wafers.

The process conditions and the process flow itself can be controlled by a controller unit 913 which comprises program instructions for monitoring, maintaining and/or adjusting certain process variables, such as HF and LF power, precursor flow rates, temperature, pressure and the like. The controller includes program instructions for performing any of the hardmask deposition processes described herein. For example, in some embodiments, the controller includes program instructions for depositing a silicon carbide sublayer (i.e., for flowing appropriate process gas and generating a plasma using required power parameters), purging the chamber with a purging gas, plasma treating the sublayer with a plasma-treatment gas, and repeating the depositing and plasma-treatment processes as many times as desired, (e.g., such as at least 10 sublayers are deposited and treated). In some embodiments, the controller includes program instructions for depositing a boron-containing hardmask, which include instructions for flowing a process gas of an appropriate composition, as was previously described, and generating a plasma using appropriate power levels (e.g., with LF/HF power ratio of at least about 1.5. In other embodiments, the controller includes program instructions for depositing a $GeN_x$ hardmask, which include instructions for flowing a process gas comprising a germanium-containing precursor and a nitrogen-containing precursor at flow rates, that preferably result in formation of a film containing at least about 60 atomic % germanium. The controller may comprise different or identical instructions for different apparatus stations, thus allowing the apparatus stations to operate either independently or synchronously.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the invention is not to be limited to the details given herein, but may be modified within the scope of the appended claims. It is understood, that in certain embodiments the hardmask film may not necessarily be actively used for masking in lithography, but may simply serve as a hard protective layer for underlying materials.

What is claimed is:

1. A method of forming a hardmask film on a semiconductor substrate, the method comprising:
   receiving a semiconductor substrate in a plasma-enhanced chemical vapor deposition (PECVD) process chamber; and
   forming a germanium-rich $GeN_x$ hardmask film having a Young's modulus of at least about 100 GPa.

2. The method of claim 1, wherein the film is comprising at least about 60 atomic % germanium excluding hydrogen.

3. The method of claim 2, wherein the germanium-rich film comprises at least about 70 atomic % germanium excluding hydrogen.

4. The method of claim 1, wherein the film has a density of at least about 4 $g/cm^3$.

5. The method of claim 4, wherein the film is substantially transparent at a wavelength used for alignment.

6. The method of claim 5, wherein the wavelength is in the visible or near-IR part of spectrum.

7. The method of claim 1, wherein the film is formed by plasma-enhanced chemical vapor deposition (PECVD).

8. The method of claim 1, wherein the film is formed by contacting the semiconductor substrate with a process gas comprising a germanium-containing precursor and a nitrogen-containing precursor in a plasma.

9. The method of claim 8, wherein the germanium-containing precursor comprises germane and wherein the nitrogen-containing precursor comprises ammonia.

10. The method of claim 9, wherein the ratio of flow rates of the germane to ammonia is at least about 0.05.

11. The method of claim 8, wherein forming the film comprises depositing the film using HFRF and LFRF plasma, wherein LFRF power level is higher than HFLF power level.

12. The method of claim 1, wherein the hardmask film is deposited onto a layer of dielectric having a dielectric constant of less than about 3.0.

13. The method of claim 1, wherein the hardmask film is deposited onto a layer of porous dielectric having a dielectric constant of less than about 2.8.

14. The method of claim 1, wherein the film is formed to a thickness of between about 500 Å and about 6,000 Å.

15. The method of claim 1, further comprising depositing a layer of photoresist and/or an antireflective layer onto the $GeN_x$ film.

16. The method of claim 15, further comprising performing a lithographic process using the $GeN_x$ hardmask, and removing the $GeN_x$ hardmask, after the lithographic process is completed.

17. The method of claim 16, wherein removing the $GeN_x$ hardmask comprises chemical mechanical polishing.

18. The method of claim 16, wherein the lithographic process comprises etching a dielectric layer in a presence of exposed $GeN_x$ film.

19. The method of claim 18, wherein the etching comprises reactive ion etching.

20. An apparatus for semiconductor processing comprising:
   (a) a PECVD process chamber;
   (b) a support configured to hold a semiconductor substrate in position during deposition; and
   (c) a controller comprising program instructions for flowing a process gas comprising a germanium-containing precursor and a nitrogen-containing precursor and for forming a plasma to deposit a germanium-rich $GeN_x$ hardmask film having a Young's modulus of at least about 100 GPa on the substrate.

21. A partially fabricated semiconductor device comprising a germanium-rich $GeN_x$ hardmask layer having a Young's modulus of at least about 100 GPa residing in contact with a dielectric layer.

* * * * *